(12) United States Patent
Siciliani et al.

(10) Patent No.: US 11,735,268 B2
(45) Date of Patent: Aug. 22, 2023

(54) MEMORY DEVICES FOR SUSPEND AND RESUME OPERATIONS

(71) Applicant: MICRON TECHNOLOGY, INC., Boise, ID (US)

(72) Inventors: Umberto Siciliani, Rubano (IT); Floriano Montemurro, Albignasego (IT); Eric N. Lee, San Jose, CA (US); Dheeraj Srinivasan, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 44 days.

(21) Appl. No.: 17/382,619

(22) Filed: Jul. 22, 2021

(65) Prior Publication Data

US 2022/0208273 A1    Jun. 30, 2022

Related U.S. Application Data

(60) Provisional application No. 63/131,830, filed on Dec. 30, 2020.

(51) Int. Cl.
| | |
|---|---|
| *G11C 16/14* | (2006.01) |
| *G11C 16/10* | (2006.01) |
| *G11C 7/10* | (2006.01) |
| *G11C 16/26* | (2006.01) |

(52) U.S. Cl.
CPC ............ *G11C 16/14* (2013.01); *G11C 7/106* (2013.01); *G11C 7/1063* (2013.01); *G11C 16/102* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 6,137,729 A | * | 10/2000 | Choi ...................... | G11C 16/16 365/185.11 |
| 2019/0318786 A1 | * | 10/2019 | Um ........................ | G06F 3/0659 |
| 2022/0051725 A1 | * | 2/2022 | Yl ........................... | G11C 16/08 |

* cited by examiner

*Primary Examiner* — Alfredo Bermudez Lozada
(74) *Attorney, Agent, or Firm* — Dicke, Billig & Czaja, PLLC

(57) ABSTRACT

Memory devices might include an array of memory cells and a controller configured to access the array of memory cells. The controller might be further configured to receive a command to perform an erase operation; and in response to the command to perform the erase operation, begin execution of the erase operation. The controller might be further configured to while executing the erase operation, receive a command to perform a program operation; in response to the command to perform the program operation, suspend the execution of the erase operation; and with the execution of the erase operation suspended, execute the program operation.

22 Claims, 30 Drawing Sheets

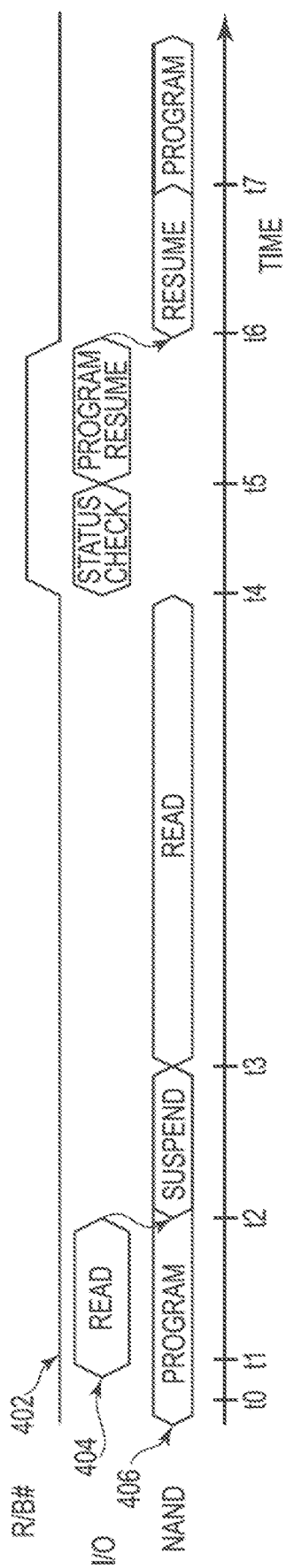
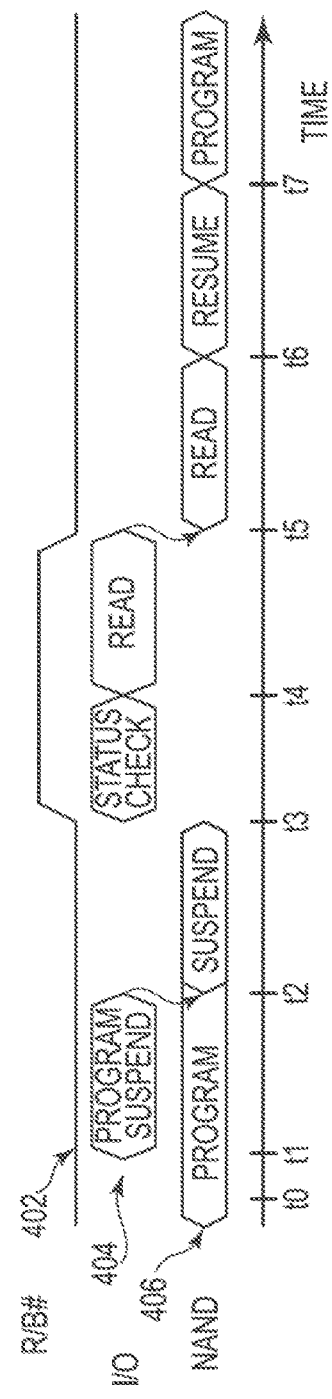
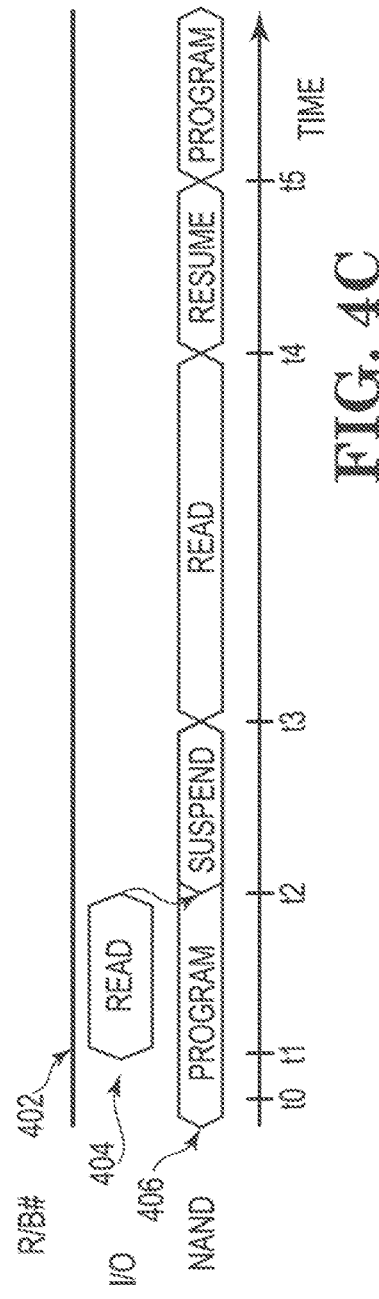
FIG. 4A
FIG. 4B
FIG. 4C

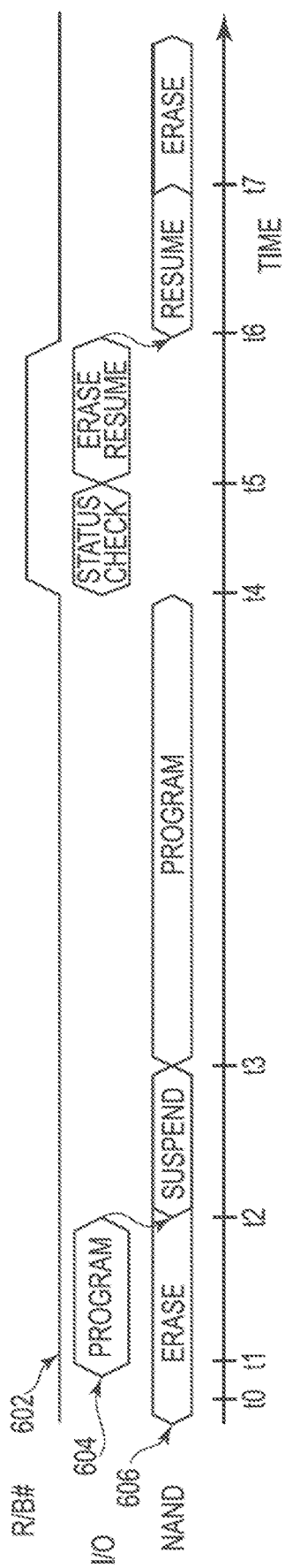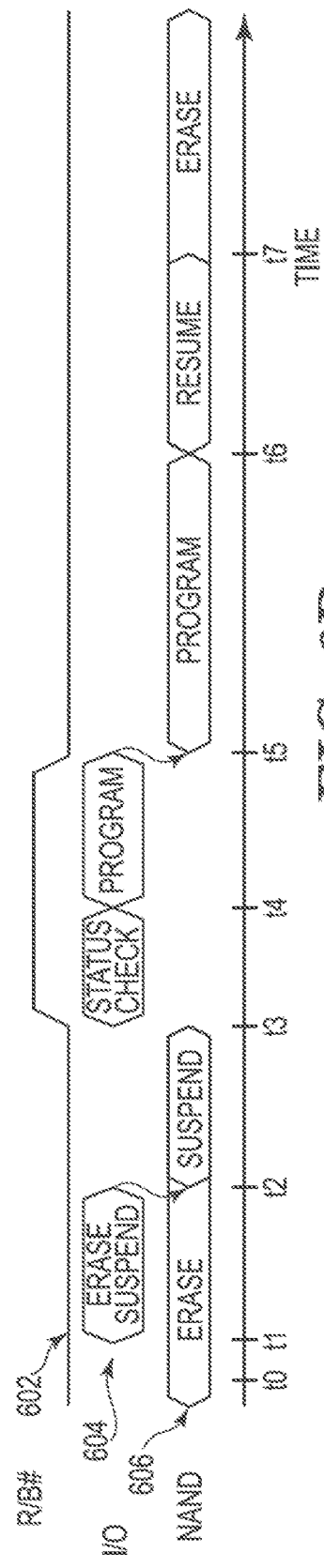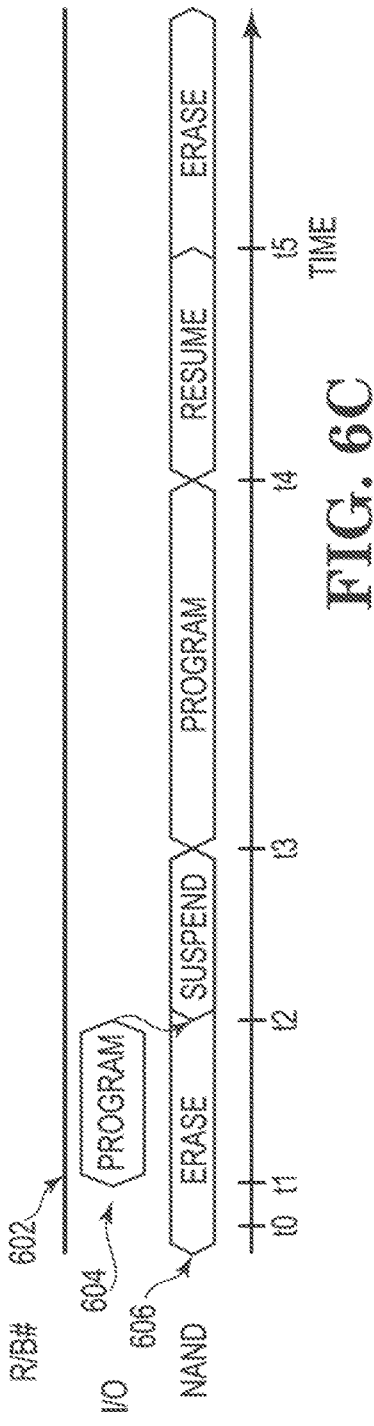

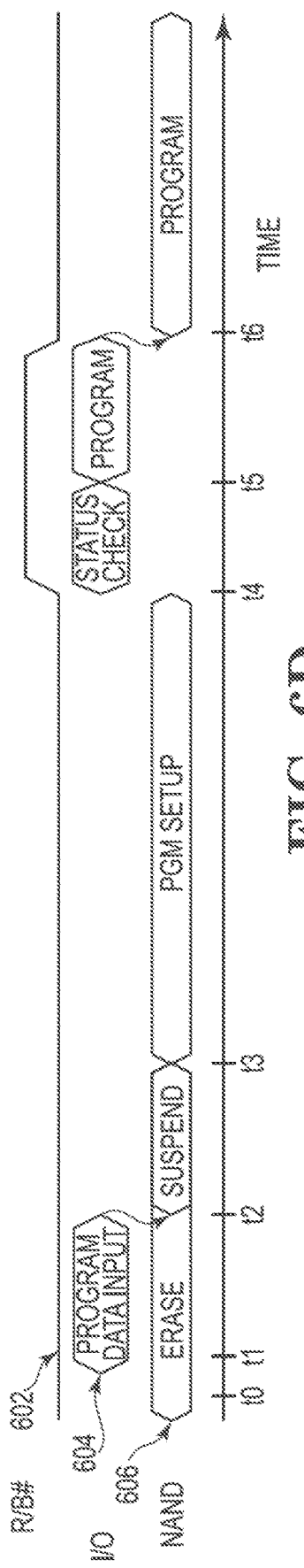
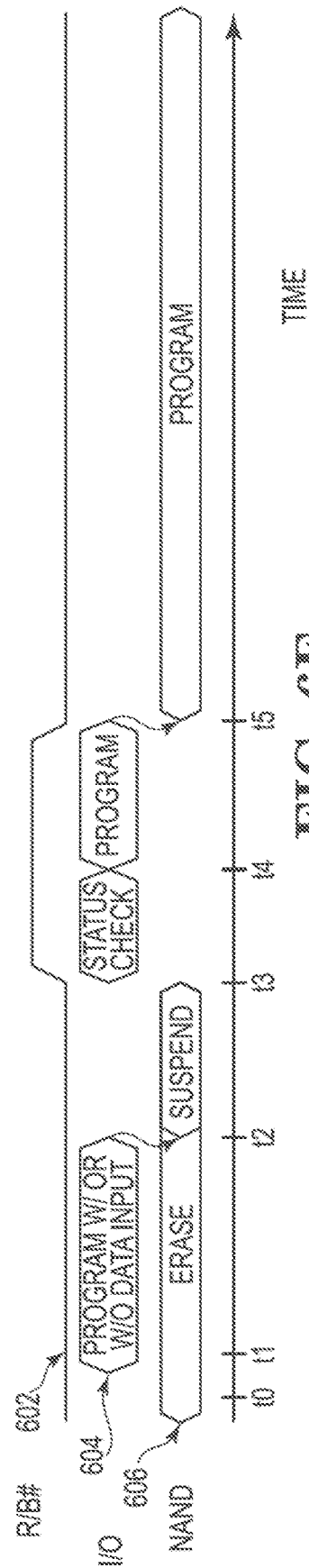

MEMORY DEVICES FOR SUSPEND AND RESUME OPERATIONS

RELATED APPLICATION

This application claims the benefit of U.S. Provisional Application No. 63/131,830, filed on Dec. 30, 2020, hereby incorporated herein in its entirety by reference.

TECHNICAL FIELD

The present disclosure relates generally to memory and, in particular, in one or more embodiments, the present disclosure relates to suspend and resume operations within memory devices.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

BRIEF DESCRIPTION OF THE DRAWINGS

FIGS. 4A-4C are simplified timing diagrams depicting suspend and resume operations within a memory according to other embodiments.

FIGS. 6A-6E are simplified timing diagrams depicting suspend and resume operations within a memory according to other embodiments.

DETAILED DESCRIPTION

Figure 1:
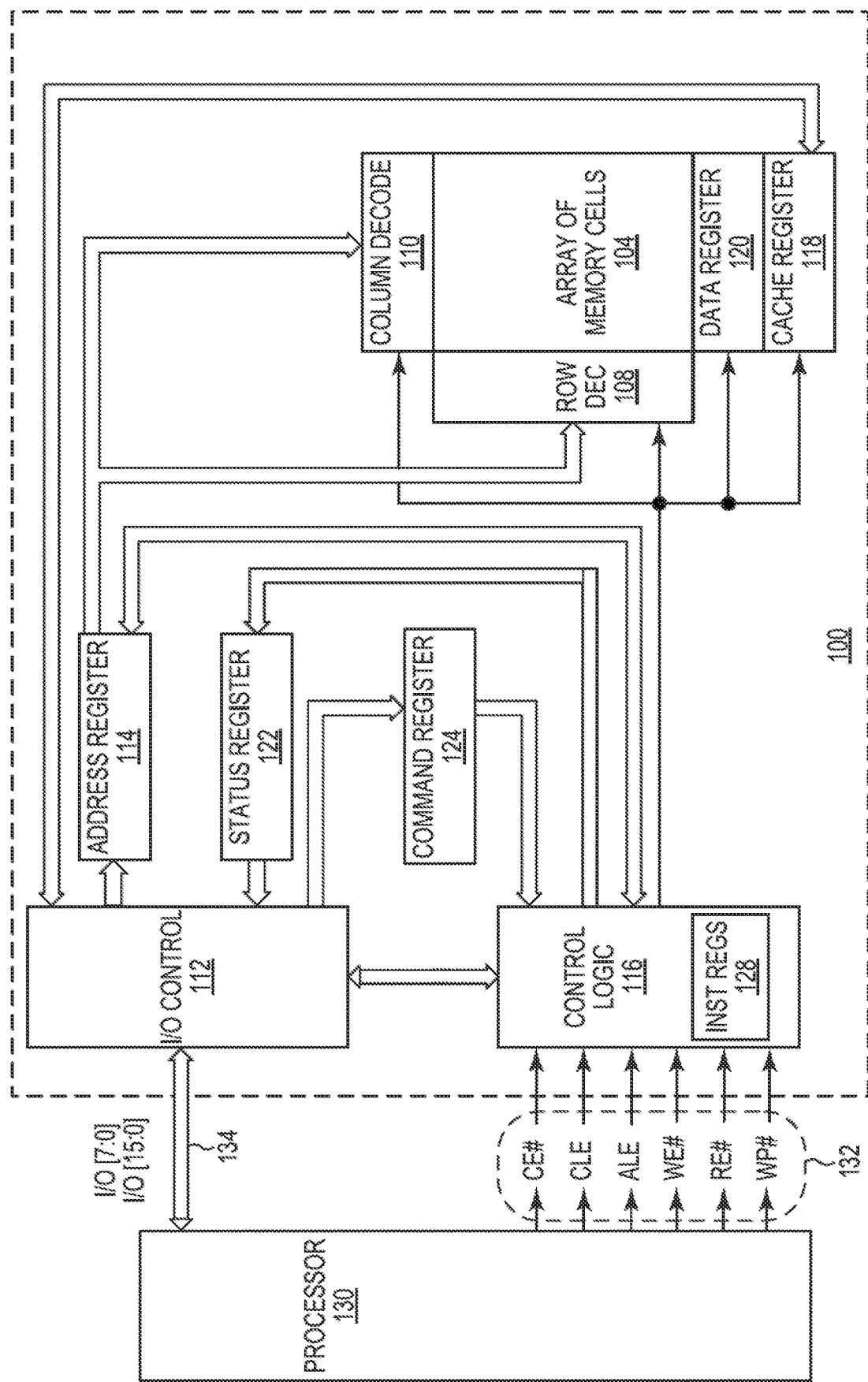
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
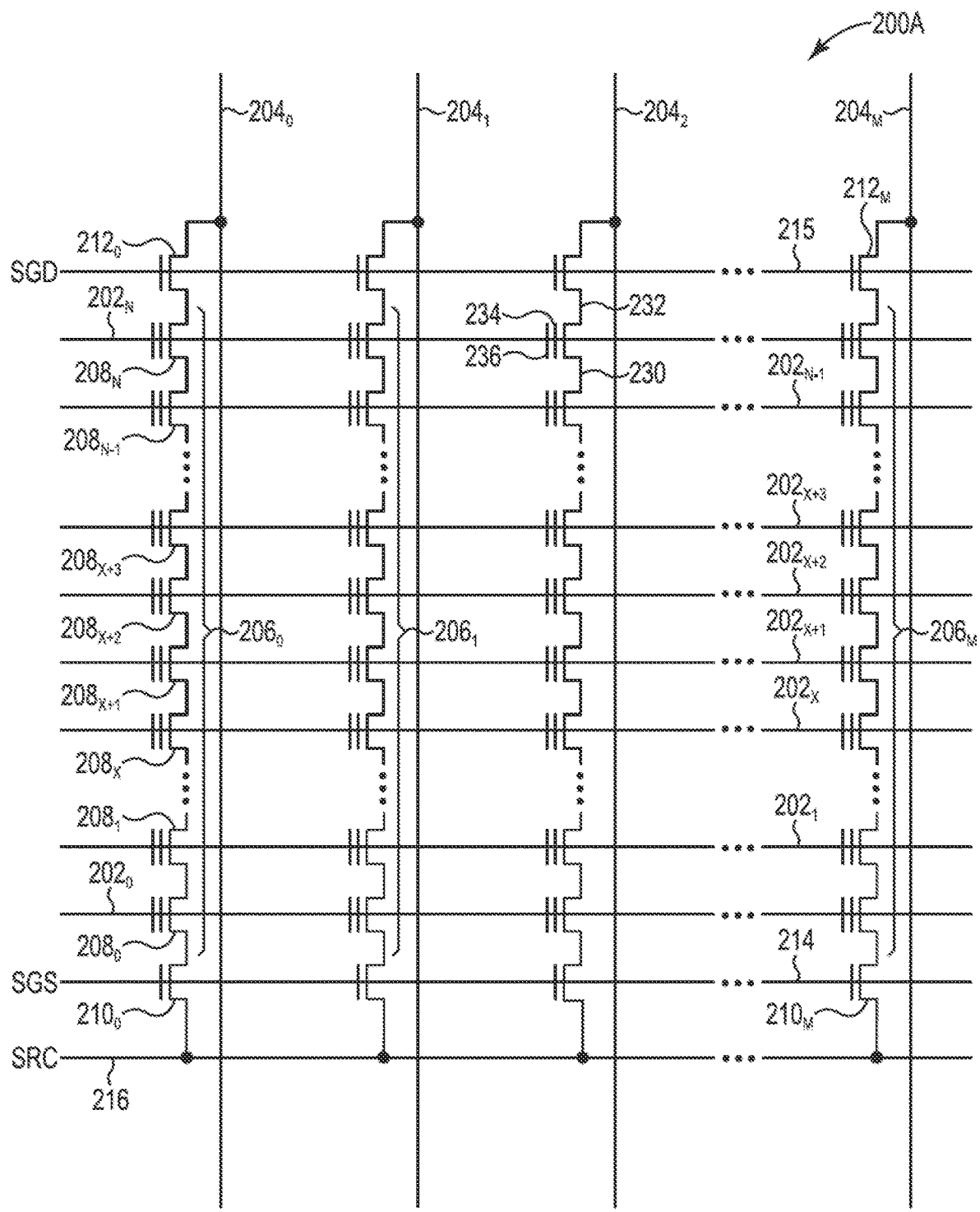
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
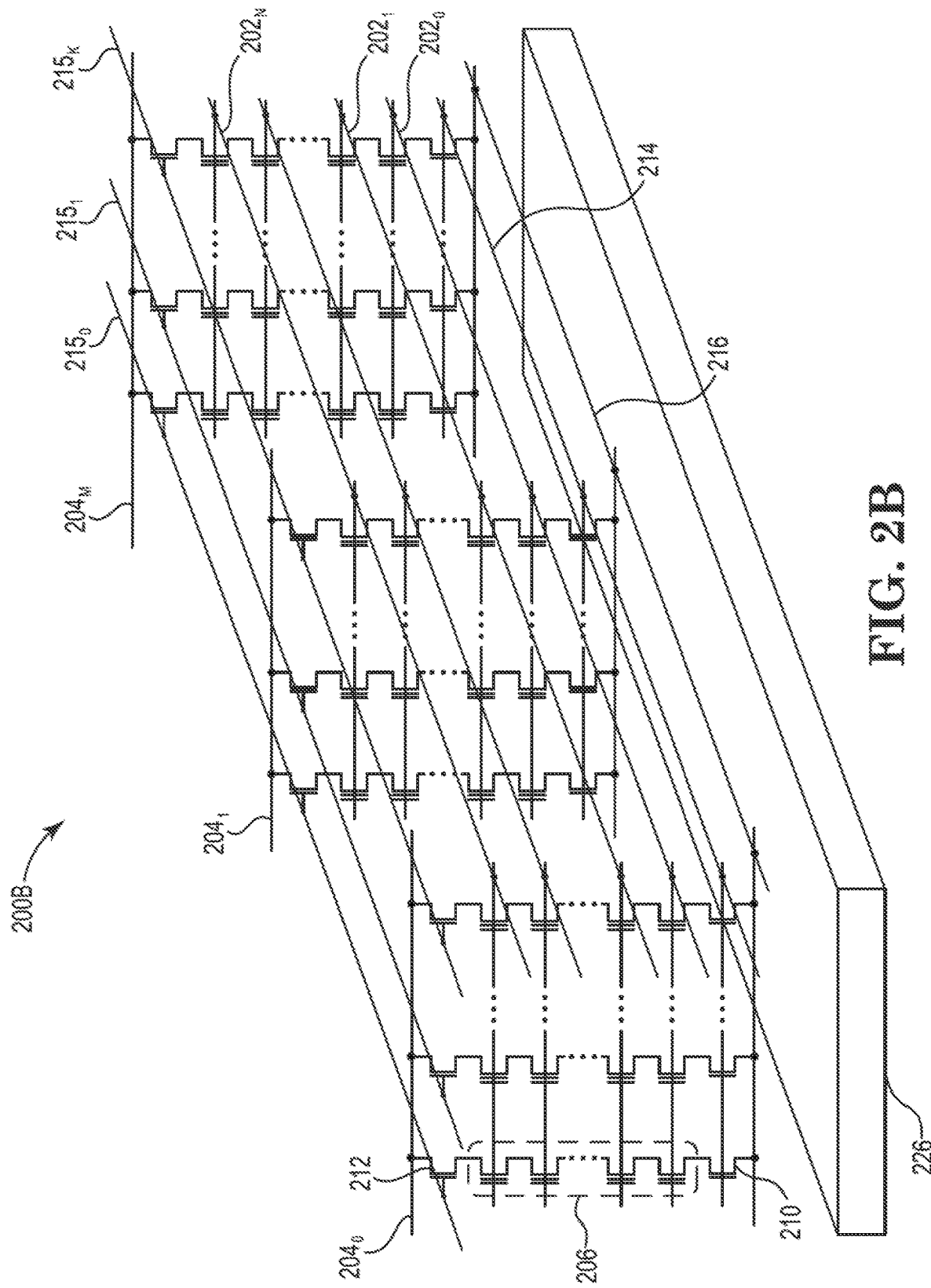

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
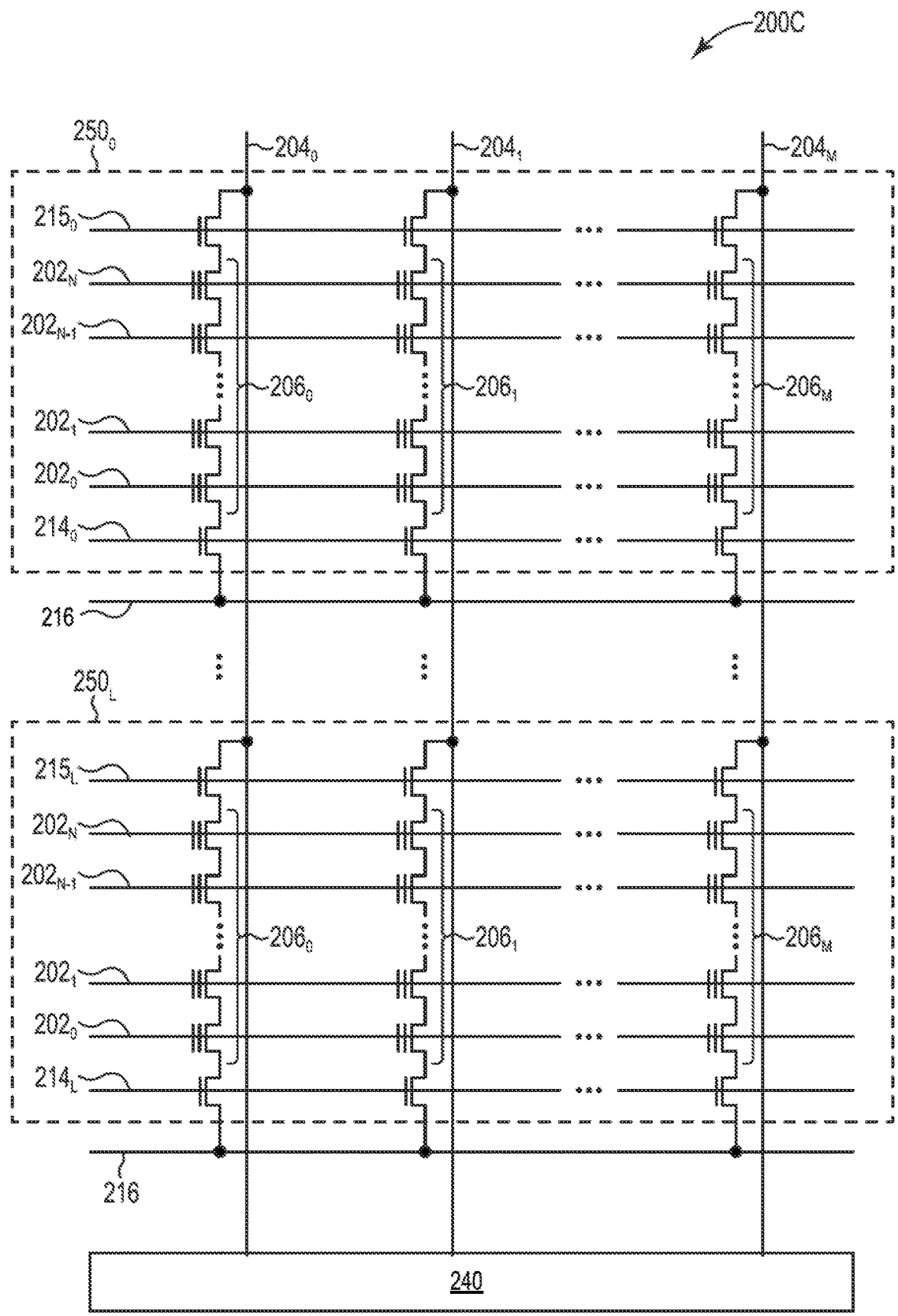

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$ to $250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$ to $250_L$.

The data lines $204_0$ to $204_M$ may be connected (e.g., selectively connected) to a buffer portion 240, which might be a portion of a data buffer of the memory. The buffer portion 240 might correspond to a memory plane (e.g., the set of blocks of memory cells $250_0$ to $250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$ to $215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

As described in more detail below with reference to FIGS. 3A-3C, a program operation of selected memory cells within an array of memory cells may be suspended to perform a higher priority read operation. Once the higher priority read operation is complete, the program operation may be resumed. Similarly, an erase operation of selected memory cells within an array of memory cells may be suspended to perform a higher priority read or program operation. Once the higher priority read or program operation is complete, the erase operation may be resumed. To suspend and resume an erase or program operation, a suspend command and a resume command may be transmitted from a host device to the memory device at appropriate times when the memory device is ready to receive the commands. Implementing these suspend and resume operations utilizes bus overhead between the host device and the memory device.

Figure 3A:
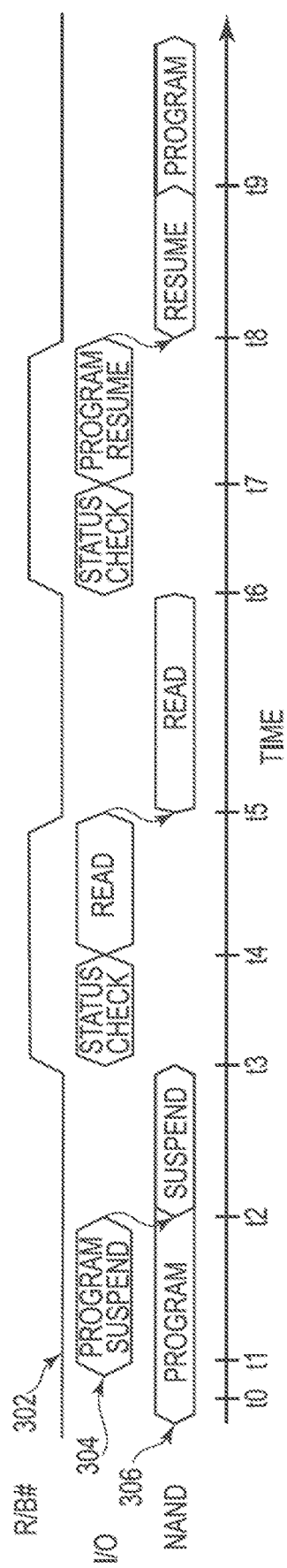
FIGS. 3A-3C are simplified timing diagrams depicting suspend and resume operations within a memory according to embodiments.

FIG. 3A is a simplified timing diagram of suspending a program operation to perform a read operation, and resuming the program operation once the read operation is complete according to an embodiment. The timing diagram includes a ready/busy control signal (R/B#) 302 (e.g., output by memory device 100 of FIG. 1), input/output (I/O) commands 304 (e.g., commands transmitted over I/O bus 134 from the host device 130 to the memory device 100), and internal memory device (NAND) operations 306 (e.g., internal operations of memory device 100). For simplicity, data transfers between the memory device and the host device are not shown in the timing diagram, such as data transfers during the read operation.

At time t0, the execution of a program operation is in progress within the memory device in response to a previous program command. With the execution of the program operation in progress, the ready/busy control signal is pulled down to indicate that the memory device is busy executing the program operation. At time t1, the host device transmits a program suspend command to the memory device. At time t2, in response to the program suspend command, the memory device begins a program suspend operation. Between times t2 and t3, the memory device may wait until an execution breakpoint is reached, suspend the execution of the program operation at the execution breakpoint, and prepare the memory device to receive other commands.

At time t3, the program operation has been suspended and the ready/busy control signal is released to indicate the memory device is ready to receive other commands. In response to the release of the ready/busy control signal, the host device requests a status check of the memory device. The status check may poll a status register (e.g., 122 of FIG. 1) of the memory device to determine whether the program operation was suspended. At time t4, in response to a successful status check, the memory device transmits a read command to the memory device. At time t5, in response to the read command, the memory device begins the execution of the read operation and pulls down the ready/busy control signal to indicate that the memory device is busy executing the read operation. In some embodiments, multiple read operations may be performed between times t5 and t6.

At time t6, the read operation is complete and the memory device releases the ready/busy control signal to indicate the memory device is ready to receive other commands. In response to the release of the ready/busy control signal, the host device requests a status check of the memory device. The status check may poll the status register of the memory device to determine whether the program operation may be resumed. At time t7, in response to a successful status check, the host device transmits a program resume command to the memory device. At time t8, in response to the program resume command, the memory device begins a program resume operation and pulls down the ready/busy control signal to indicate that the memory device is busy executing the program resume operation. Between times t8 and t9, the memory device prepares relevant portions (e.g., the memory array) of the memory device to resume the program operation. At time t9, the program resume operation is complete and the execution of the program operation continues.

The read command at time t4 may include a read parameter page command, a read unique ID command, a set feature command, a get feature command, a read page multi-plane command, an iWL read command, or another suitable read command. A read parameter page command may be used to read the capabilities of the memory device. The read unique ID command may be used to read a unique identifier programmed into the memory device. The set feature command and the get feature command may be used to modify the memory device's default power-on behavior. The read page multi-plane command may be used to copy data from more than one memory plane simultaneously to specified cache registers. The iWL read command may be used to read data from memory cells connected to intermediate word lines (e.g., access lines positioned between the uppermost access lines and the lowermost access lines within a block of memory cells).

Figure 3B:
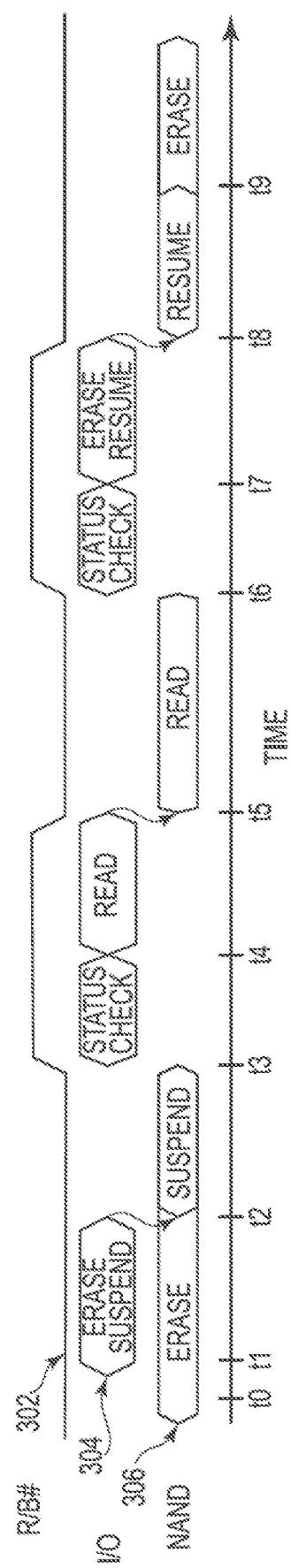

FIG. 3B is a simplified timing diagram of suspending an erase operation to perform a read operation, and resuming the erase operation once the read operation is complete according to an embodiment. The timing diagram includes a ready/busy control signal (R/B#) 302, input/output (I/O) commands 304, and internal memory device (NAND) operations 306. For simplicity, data transfers between the memory device and the host device are not shown in the timing diagram, such as data transfers during the read operation.

At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits an erase suspend command to the memory device. At time t2, in response to the erase suspend command, the memory device begins an erase suspend operation. Between times t2 and t3, the memory device may wait until an execution breakpoint is reached, suspend the execution of the erase operation at the execution breakpoint, and prepare the memory device to receive other commands.

At time t3, the erase operation has been suspended and the ready/busy control signal is released to indicate the memory device is ready to receive other commands. In response to the release of the ready/busy control signal, the host device requests a status check of the memory device. The status check may poll a status register (e.g., 122 of FIG. 1) of the memory device to determine whether the erase operation was suspended. At time t4, in response to a successful status check, the memory device transmits a read command to the memory device. At time t5, in response to the read command, the memory device begins the execution of the read operation and pulls down the ready/busy control signal to indicate that the memory device is busy executing the read operation. In some embodiments, multiple read operations may be performed between times t5 and t6.

At time t6, the read operation is complete and the memory device releases the ready/busy control signal to indicate the memory device is ready to receive other commands. In response to the release of the ready/busy control signal, the host device requests a status check of the memory device. The status check may poll the status register of the memory device to determine whether the erase operation may be resumed. At time t7, in response to a successful status check, the host device transmits an erase resume command to the memory device. At time t8, in response to the erase resume command, the memory device begins an erase resume operation and pulls down the ready/busy control signal to indicate that the memory device is busy executing the erase resume operation. Between times t8 and t9, the memory device prepares relevant portions (e.g., the memory array) of the memory device to resume the erase operation. At time t9, the erase resume operation is complete and the execution of the erase operation continues.

The read command at time t4 may include a read parameter page command, a read unique ID command, a set feature command, a get feature command, a read page multi-plane command, an iWL read command, a cache read command, a copyback command, or another suitable read command. The cache read command may be used to output data from the cache register while other data is read into the data register. A copyback command may be used to transfer data within a memory plane from one page to another page using the cache register.

Figure 3C:
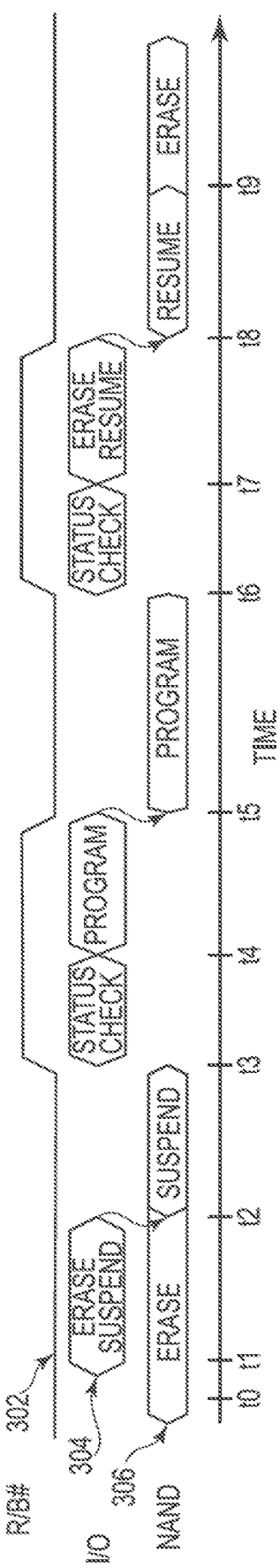

FIG. 3C is a simplified timing diagram of suspending an erase operation to perform a program operation, and resuming the erase operation once the program operation is complete according to an embodiment. The timing diagram includes a ready/busy control signal (R/B#) 302, input/output (I/O) commands 304, and internal memory device (NAND) operations 306. For simplicity, data transfers between the memory device and the host device are not shown in the timing diagram, such as data transfers during the program operation.

At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits an erase suspend command to the memory device. At time t2, in response to the erase suspend command, the memory device begins an erase suspend operation. Between times t2 and t3, the memory device may wait until an execution breakpoint is reached, suspend the execution of the erase operation at the execution breakpoint, and prepare the memory device to receive other commands.

At time t3, the erase operation has been suspended and the ready/busy control signal is released to indicate the memory device is ready to receive other commands. In response to the release of the ready/busy control signal, the host device requests a status check of the memory device. The status check may poll a status register (e.g., 122 of FIG. 1) of the memory device to determine whether the erase operation was suspended. At time t4, in response to a successful status check, the memory device transmits a program command to the memory device. At time t5, in response to the program command, the memory device begins the execution of the program operation and pulls down the ready/busy control signal to indicate that the memory device is busy executing the program operation. In some embodiments, multiple program operations may be performed between times t5 and t6.

At time t6, the program operation is complete and the memory device releases the ready/busy control signal to indicate the memory device is ready to receive other commands. In response to the release of the ready/busy control signal, the host device requests a status check of the memory device. The status check may poll the status register of the memory device to determine whether the erase operation may be resumed. At time t7, in response to a successful status check, the host device transmits an erase resume command to the memory device. At time t8, in response to the erase resume command, the memory device begins an erase resume operation and pulls down the ready/busy control signal to indicate that the memory device is busy executing the erase resume operation. Between times t8 and t9, the memory device prepares relevant portions (e.g., the memory array) of the memory device to resume the erase operation. At time t9, the erase resume operation is complete and the execution of the erase operation continues.

The program command at time t4 may include an initial program command, a final program confirm command, a multi-plane program confirm command, a cache program confirm command, or another suitable program command. An initial program command may be the first command a host device transmits to a memory device to indicate the beginning of a command sequence (e.g., commands, addresses, and data) for a program operation. A final program confirm command may be the last command a host device transmits to a memory device to indicate the end of the command sequence for the program operation. A multi-plane program confirm command may be an intermediate command within the command sequence following addresses and data for programming memory cells of a particular plane of the memory device. A cache program confirm command may be used in place of a final program confirm command to enable the memory device to write data into the memory array from the data register while loading additional data to be written to the memory array into the cache register.

The time to implement the suspend and resume operations described above with reference to FIGS. 3A-3C may be unpredictable due to the internal memory device commands used to implement the suspend and resume operations. In addition, the host device may request a status check to determine whether the operations have been suspended or may be resumed. Due to the internal memory device commands and the status checks, the latency to implement the suspend and resume operations is unpredictable (e.g., the latency between times t1 and t4 and between times t6 and t9 in FIGS. 3A-3C).

FIG. 4A is a simplified timing diagram of suspending a program operation to perform a read operation, and resuming the program operation once the read operation is complete according to another embodiment. The timing diagram includes a ready/busy control signal (R/B#) 402 (e.g., output by memory device 100 of FIG. 1), input/output (I/O) commands 404 (e.g., commands transmitted over I/O bus 134 from the host device 130 to the memory device 100), and internal memory device (NAND) operations 406 (e.g., internal operations of memory device 100). For simplicity, data transfers between the memory device and the host device are not shown in the timing diagram, such as data transfers during the read operation.

At time t0, the execution of a program operation is in progress within the memory device in response to a previous program command. With the execution of the program operation in progress, the ready/busy control signal is pulled down to indicate that the memory device is busy executing the program operation. At time t1, the host device transmits a read command to the memory device. At time t2, in response to the read command, the memory device begins a program suspend operation (e.g., without receiving a suspend command). Between times t2 and t3, the memory device may wait until an execution breakpoint is reached, suspend the execution of the program operation at the execution breakpoint, and prepare the memory device to execute the read operation.

At time t3, the program operation has been suspended and the ready/busy control signal remains pulled down. At time t3, in response to suspending the execution of the program operation, the memory device begins the execution of the read operation. At time t4, the read operation is complete and the memory device releases the ready/busy control signal to indicate the memory device is ready to receive other commands. In response to the release of the ready/busy control signal, the host device requests a status check of the memory device. The status check may poll a status register (e.g., 122 of FIG. 1) of the memory device to determine whether the program operation may be resumed. At time t5, in response to a successful status check, the host device transmits a program resume command to the memory device. At time t6, in response to the program resume command, the memory device begins a program resume operation and pulls down the ready/busy control signal to indicate that the memory device is busy executing the program resume operation. Between times t6 and t7, the memory device prepares relevant portions (e.g., the memory array) of the memory device to resume the program operation. At time t7, the program resume operation is complete and the execution of the program operation continues.

In the embodiment of FIG. 4A, a suspend command is not used. Rather, in response to the read command, the memory device automatically suspends the execution of the program operation and begins the execution of the read operation. In addition, the host device does not transmit a status check (e.g., such as the status check at time t3 of FIG. 3A) to the memory device before beginning execution of the read operation. Accordingly, the program suspend operation and subsequent read operation of the embodiment of FIG. 4A may be implemented with less latency than in the embodiment of FIG. 3A.

FIG. 4B is a simplified timing diagram of suspending a program operation to perform a read operation, and resuming the program operation once the read operation is complete according to another embodiment. The timing diagram includes a ready/busy control signal (R/B#) 402, input/output (I/O) commands 404, and internal memory device (NAND) operations 406. For simplicity, data transfers between the memory device and the host device are not shown in the timing diagram, such as data transfers during the read operation.

At time t0, the execution of a program operation is in progress within the memory device in response to a previous program command. With the execution of the program operation in progress, the ready/busy control signal is pulled down to indicate that the memory device is busy executing the program operation. At time t1, the host device transmits a program suspend command to the memory device. At time t2, in response to the program suspend command, the memory device begins a program suspend operation. Between times t2 and t3, the memory device may wait until an execution breakpoint is reached, suspend the execution of the program operation at the execution breakpoint, and prepare the memory device to receive other commands.

At time t3, the program operation has been suspended and the ready/busy control signal is released to indicate the memory device is ready to receive other commands. In response to the release of the ready/busy control signal, the host device requests a status check of the memory device. The status check may poll a status register (e.g., 122 of FIG. 1) of the memory device to determine whether the program operation was suspended. At time t4, in response to a successful status check, the memory device transmits a read command to the memory device. At time t5, in response to the read command, the memory device begins the execution of the read operation and pulls down the ready/busy control signal to indicate that the memory device is busy executing the read operation.

At time t6, the read operation is complete and the memory device automatically begins a program resume operation (e.g., without receiving a program resume command). Between times t6 and t7, the memory device prepares relevant portions (e.g., the memory array) of the memory device to resume the program operation. At time t7, the program resume operation is complete and the execution of the program operation continues.

In the embodiment of FIG. 4B, a resume command is not used. Rather, in response to the completion of the read operation, the memory device automatically resumes the execution of the program operation. In addition, the host device does not transmit a status check (e.g., such as the status check at time t6 of FIG. 3A) to the memory device before resuming the execution of the program operation. Accordingly, the program resume operation in the embodiment of FIG. 4B may be implemented with less latency than in the embodiment of FIG. 3A.

FIG. 4C is a simplified timing diagram of suspending a program operation to perform a read operation, and resuming the program operation once the read operation is complete according to another embodiment. The timing diagram includes a ready/busy control signal (R/B#) 402, input/output (I/O) commands 404, and internal memory device (NAND) operations 406. For simplicity, data transfers between the memory device and the host device are not shown in the timing diagram, such as data transfers during the read operation.

At time t0, the execution of a program operation is in progress within the memory device in response to a previous program command. With the execution of the program operation in progress, the ready/busy control signal is pulled down to indicate that the memory device is busy executing the program operation. At time t1, the host device transmits a read command to the memory device. At time t2, in response to the read command, the memory device begins a program suspend operation (e.g., without receiving a suspend command). Between times t2 and t3, the memory device may wait until an execution breakpoint is reached, suspend the execution of the program operation at the execution breakpoint, and prepare the memory device to execute the read operation.

At time t3, the program operation has been suspended and the ready/busy control signal remains pulled down. At time t3, in response to suspending the execution of the program operation, the memory device begins the execution of the read operation. At time t4, the read operation is complete and the memory device automatically begins a program resume operation (e.g., without receiving a program resume command). Between times t4 and t5, the memory device prepares relevant portions (e.g., the memory array) of the memory device to resume the program operation. At time t5, the program resume operation is complete and the execution of the program operation continues.

In the embodiment of FIG. 4C, neither a suspend command nor a resume command is used. Rather, in response to the read command, the memory device automatically suspends the execution of the program operation and begins the execution of the read operation. In response to the completion of the read operation, the memory device automatically resumes the execution of the program operation. In addition, the host device does not transmit a status check (e.g., such as the status check at time t3 or t6 of FIG. 3A) to the memory device before suspending or resuming the execution of the program operation. Accordingly, the program suspend and resume operations may be implemented with less latency in the embodiment of FIG. 4C than in the embodiment of FIG. 3A.

Figure 5A:
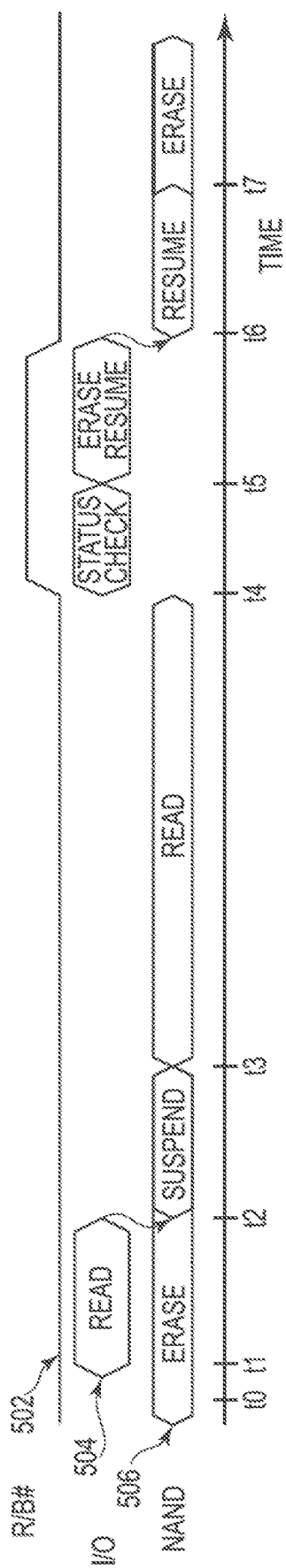
FIGS. 5A-5C are simplified timing diagrams depicting suspend and resume operations within a memory according to other embodiments.

FIG. 5A is a simplified timing diagram of suspending an erase operation to perform a read operation, and resuming the erase operation once the read operation is complete according to another embodiment. The timing diagram includes a ready/busy control signal (R/B#) 502 (e.g., output by memory device 100 of FIG. 1), input/output (I/O) commands 504 (e.g., commands transmitted over I/O bus 134 from the host device 130 to the memory device 100), and internal memory device (NAND) operations 506 (e.g., internal operations of memory device 100). For simplicity, data transfers between the memory device and the host device are not shown in the timing diagram, such as data transfers during the read operation.

At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits a read command to the memory device. At time t2, in response to the read command, the memory device begins an erase suspend operation (e.g., without receiving a suspend command). Between times t2 and t3, the memory device may wait until an execution breakpoint is reached, suspend the execution of the erase operation at the execution breakpoint, and prepare the memory device to execute the read operation.

At time t3, the erase operation has been suspended and the ready/busy control signal remains pulled down. At time t3, in response to suspending the execution of the erase operation, the memory device begins the execution of the read operation. At time t4, the read operation is complete and the memory device releases the ready/busy control signal to indicate the memory device is ready to receive other commands. In response to the release of the ready/busy control signal, the host device requests a status check of the memory device. The status check may poll a status register (e.g., 122 of FIG. 1) of the memory device to determine whether the erase operation may be resumed. At time t5, in response to a successful status check, the host device transmits an erase resume command to the memory device. At time t6, in response to the erase resume command, the memory device begins an erase resume operation and pulls down the ready/busy control signal to indicate that the memory device is busy executing the erase resume operation. Between times t6 and t7, the memory device prepares relevant portions (e.g., the memory array) of the memory device to resume the erase operation. At time t7, the erase resume operation is complete and the execution of the erase operation continues.

In the embodiment of FIG. 5A, a suspend command is not used. Rather, in response to the read command, the memory device automatically suspends the execution of the erase operation and begins the execution of the read operation. In addition, the host device does not transmit a status check (e.g., such as the status check at time t3 of FIG. 3B) to the memory device before beginning the execution of the read operation. Accordingly, the erase suspend operation and subsequent read operation of the embodiment of FIG. 5A may be implemented with less latency than in the embodiment of FIG. 3B.

Figure 5B:
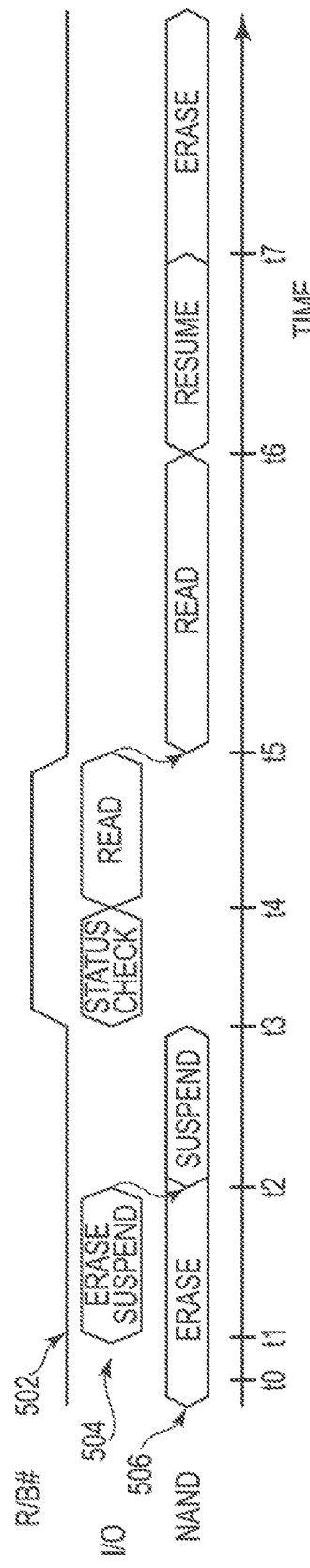

FIG. 5B is a simplified timing diagram of suspending an erase operation to perform a read operation, and resuming the erase operation once the read operation is complete according to another embodiment. The timing diagram includes a ready/busy control signal (R/B#) 502, input/output (I/O) commands 504, and internal memory device (NAND) operations 506. For simplicity, data transfers between the memory device and the host device are not shown in the timing diagram, such as data transfers during the read operation.

At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits an erase suspend command to the memory device. At time t2, in response to the erase suspend command, the memory device begins an erase suspend operation. Between times t2 and t3, the memory device may wait until an execution breakpoint is reached, suspend the execution of the erase operation at the execution breakpoint, and prepare the memory device to receive other commands.

At time t3, the program operation has been suspended and the ready/busy control signal is released to indicate the memory device is ready to receive other commands. In response to the release of the ready/busy control signal, the host device requests a status check of the memory device. The status check may poll a status register (e.g., 122 of FIG. 1) of the memory device to determine whether the erase operation was suspended. At time t4, in response to a successful status check, the memory device transmits a read command to the memory device. At time t5, in response to the read command, the memory device begins the execution of a read operation and pulls down the ready/busy control signal to indicate that the memory device is busy executing the read operation.

At time t6, the read operation is complete and the memory device automatically begins an erase resume operation (e.g., without receiving an erase resume command). Between times t6 and t7, the memory device prepares relevant portions (e.g., the memory array) of the memory device to resume the erase operation. At time t7, the erase resume operation is complete and the execution of the erase operation continues.

In the embodiment of FIG. 5B, a resume command is not used. Rather, in response to the completion of the read operation, the memory device automatically resumes the execution of the erase operation. In addition, the host device does not transmit a status check (e.g., such as the status check at time t6 of FIG. 3B) to the memory device before resuming the execution of the erase operation. Accordingly, the erase resume operation in the embodiment of FIG. 5B may be implemented with less latency than in the embodiment of FIG. 3B.

Figure 5C:
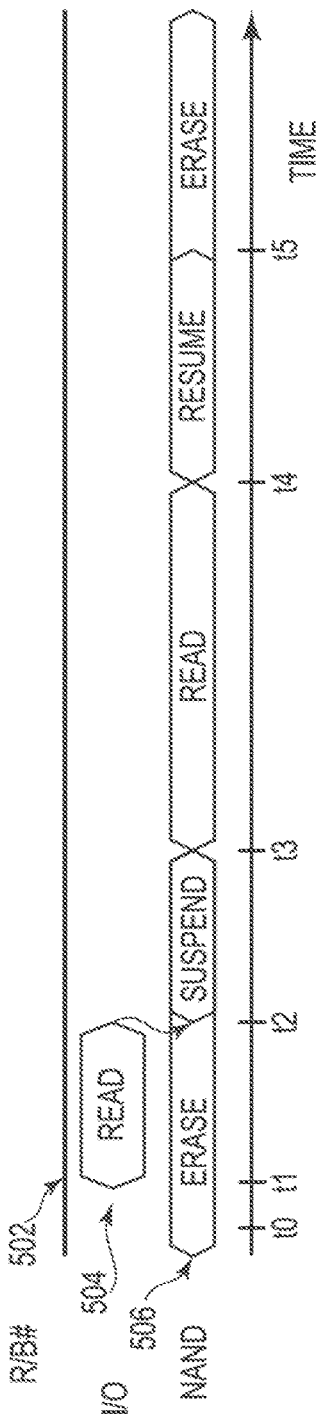

FIG. 5C is a simplified timing diagram of suspending an erase operation to perform a read operation, and resuming the erase operation once the read operation is complete according to another embodiment. The timing diagram includes a ready/busy control signal (R/B#) 502, input/output (I/O) commands 504, and internal memory device (NAND) operations 506. For simplicity, data transfers between the memory device and the host device are not shown in the timing diagram, such as data transfers during the read operation.

At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits a read command to the memory device. At time t2, in response to the read command, the memory device begins an erase suspend operation (e.g., without receiving a suspend command). Between times t2 and t3, the memory device may wait until an execution breakpoint is reached, suspend the execution of the erase operation at the execution breakpoint, and prepare the memory device to execute the read operation.

At time t3, the erase operation has been suspended and the ready/busy control signal remains pulled down. At time t3, in response to suspending the execution of the erase operation, the memory device begins the execution of the read operation. At time t4, the read operation is complete and the memory device automatically begins an erase resume operation (e.g., without receiving an erase resume command). Between times t4 and t5, the memory device prepares relevant portions (e.g., the memory array) of the memory device to resume the erase operation. At time t5, the erase resume operation is complete and the execution of the erase operation continues.

In the embodiment of FIG. 5C, neither a suspend command nor a resume command is used. Rather, in response to the read command, the memory device automatically suspends the execution of the erase operation and begins the execution of the read operation. In response to the completion of the read operation, the memory device automatically resumes the execution of the erase operation. In addition, the host device does not transmit a status check (e.g., such as the status check at time t3 or t6 of FIG. 3B) to the memory device before suspending or resuming the execution of the erase operation. Accordingly, the erase suspend and resume operations may be implemented with less latency in the embodiment of FIG. 5C than in the embodiment of FIG. 3B.

FIG. 6A is a simplified timing diagram of suspending an erase operation to perform a program operation, and resuming the erase operation once the program operation is complete according to another embodiment. The timing diagram includes a ready/busy control signal (R/B#) 602 (e.g., output by memory device 100 of FIG. 1), input/output (I/O) commands 604 (e.g., commands transmitted over I/O bus 134 from the host device 130 to the memory device 100), and internal memory device (NAND) operations 606 (e.g., internal operations of memory device 100). For simplicity, data transfers between the memory device and the host device are not shown in the timing diagram, such as data transfers during the program operation.

At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits a program command to the memory device. At time t2, in response to the program command, the memory device begins an erase suspend operation (e.g., without receiving a suspend command). Between times t2 and t3, the memory device may wait until an execution breakpoint is reached, suspend the execution of the erase operation at the execution breakpoint, and prepare the memory device to execute the program operation.

At time t3, the erase operation has been suspended and the ready/busy control signal remains pulled down. At time t3, in response to suspending the execution of the erase operation, the memory device begins the execution of the program operation. At time t4, the program operation is complete and the memory device releases the ready/busy control signal to indicate the memory device is ready to receive other commands. In response to the release of the ready/busy control signal, the host device requests a status check of the memory device. The status check may poll a status register (e.g., 122 of FIG. 1) of the memory device to determine whether the erase operation may be resumed. At time t5, in response to a successful status check, the host device transmits an erase resume command to the memory device. At time t6, in response to the erase resume command, the memory device begins an erase resume operation and pulls down the ready/busy control signal to indicate that the memory device is busy executing the erase resume operation. Between times t6 and t7, the memory device prepares relevant portions (e.g., the memory array) of the memory device to resume the erase operation. At time t7, the erase resume operation is complete and the execution of the erase operation continues.

In the embodiment of FIG. 6A, a suspend command is not used. Rather, in response to the program command, the memory device automatically suspends the execution of the erase operation and begins the execution of the program operation. In addition, the host device does not transmit a status check (e.g., such as the status check at time t3 of FIG. 3C) to the memory device before beginning execution of the program operation. Accordingly, the erase suspend operation and subsequent program operation of the embodiment of FIG. 6A may be implemented with less latency than in the embodiment of FIG. 3C.

FIG. 6B is a simplified timing diagram of suspending an erase operation to perform a program operation, and resuming the erase operation once the program operation is complete according to another embodiment. The timing diagram includes a ready/busy control signal (R/B#) 602, input/output (I/O) commands 604, and internal memory device (NAND) operations 606. For simplicity, data transfers between the memory device and the host device are not shown in the timing diagram, such as data transfers during the program operation.

At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits an erase suspend command to the memory device. At time t2, in response to the erase suspend command, the memory device begins an erase suspend operation. Between times t2 and t3, the memory device may wait until an execution breakpoint is reached, suspend the execution of the erase operation at the execution breakpoint, and prepare the memory device to receive other commands.

At time t3, the program operation has been suspended and the ready/busy control signal is released to indicate the memory device is ready to receive other commands. In response to the release of the ready/busy control signal, the host device requests a status check of the memory device. The status check may poll a status register (e.g., 122 of FIG. 1) of the memory device to determine whether the erase operation was suspended. At time t4, in response to a successful status check, the memory device transmits a program command to the memory device. At time t5, in response to the program command, the memory device begins the execution of the program operation and pulls down the ready/busy control signal to indicate that the memory device is busy executing the program operation.

At time t6, the program operation is complete and the memory device automatically begins an erase resume operation (e.g., without receiving an erase resume command). Between times t6 and t7, the memory device prepares relevant portions (e.g., the memory array) of the memory device to resume the erase operation. At time t7, the erase resume operation is complete and the execution of the erase operation continues.

In the embodiment of FIG. 6B, a resume command is not used. Rather, in response to the completion of the program operation, the memory device automatically resumes the execution of the erase operation. In addition, the host device does not transmit a status check (e.g., such as the status check at time t6 of FIG. 3C) to the memory device before resuming the execution of the erase operation. Accordingly, the erase resume operation in the embodiment of FIG. 6B may be implemented with less latency than in the embodiment of FIG. 3C.

FIG. 6C is a simplified timing diagram of suspending an erase operation to perform a program operation, and resuming the erase operation once the program operation is complete according to another embodiment. The timing diagram includes a ready/busy control signal (R/B#) 602, input/output (I/O) commands 604, and internal memory device (NAND) operations 606. For simplicity, data transfers between the memory device and the host device are not shown in the timing diagram, such as data transfers during a program operation.

At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits a program command to the memory device. At time t2, in response to the program command, the memory device begins an erase suspend operation (e.g., without receiving a suspend command). Between times t2 and t3, the memory device may wait until an execution breakpoint is reached, suspend the execution of the erase operation at the execution breakpoint, and prepare the memory device to execute the program operation.

At time t3, the erase operation has been suspended and the ready/busy control signal remains pulled down. At time t3, in response to suspending the execution of the erase operation, the memory device begins the execution of the program operation. At time t4, the program operation is complete and the memory device automatically begins an erase resume operation (e.g., without receiving an erase resume command). Between times t4 and t5, the memory device prepares relevant portions (e.g., the memory array) of the memory device to resume the erase operation. At time t5, the erase resume operation is complete and the execution of the erase operation continues.

In the embodiment of FIG. 6C, neither a suspend command nor a resume command is used. Rather, in response to the program command, the memory device automatically suspends the execution of the erase operation and begins the execution of the program operation. In response to the completion of the program operation, the memory device automatically resumes the execution of the erase operation. In addition, the host device does not transmit a status check (e.g., such as the status check at time t3 or t6 of FIG. 3C) to the memory device before suspending or resuming the execution of the erase operation. Accordingly, the erase suspend and resume operations may be implemented with less latency in the embodiment of FIG. 6C than in the embodiment of FIG. 3C.

FIG. 6D is a simplified timing diagram of suspending an erase operation to perform a program operation according to another embodiment. The timing diagram includes a ready/busy control signal (R/B#) 602, input/output (I/O) commands 604, and internal memory device (NAND) operations 606. At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits a program command sequence with data input (e.g., an address and/or data for programming) for a program operation to the memory device. At time t2, in response to the program command sequence with data input, the memory device begins an erase suspend operation (e.g., without receiving a suspend command). The memory device may begin the erase suspend operation in response to receiving an initial program command, an address, data, or other portion of the command sequence. Between times t2 and t3, the memory device may wait until an execution breakpoint is reached, suspend the execution of the erase operation at the execution breakpoint, and prepare the memory device to execute the program operation.

At time t3, the erase operation has been suspended and the ready/busy control signal remains pulled down. At time t3, in response to suspending the execution of the erase operation, the memory device begins the execution of the program operation (e.g., a program setup operation based on the data input). At time t4, the program setup operation is complete and the memory device releases the ready/busy control signal to indicate the memory device is ready to receive other commands. In response to the release of the ready/busy control signal, the host device requests a status check of the memory device. The status check may poll a status register (e.g., 122 of FIG. 1) of the memory device to determine whether the program setup operation is complete. At time t5, in response to a successful status check, the host device transmits another program command to the memory device. At time t6, in response to the program command, the memory device continues execution of the program operation and pulls down the ready/busy control signal to indicate that the memory device is busy executing the program operation. Once the program operation is complete, the erase operation may be resumed in response to an erase resume command as illustrated in FIG. 6A or automatically as illustrated in FIG. 6B.

FIG. 6E is a simplified timing diagram of suspending an erase operation to perform a program operation according to another embodiment. The timing diagram includes a ready/busy control signal (R/B#) 602, input/output (I/O) commands 604, and internal memory device (NAND) operations 606. At time t0, the execution of an erase operation is in progress within the memory device in response to a previous erase command. With the execution of the erase operation in progress, the ready/busy control signal is pulled down to indicate that the memory device is busy executing the erase operation. At time t1, the host device transmits a program command (e.g., an initial program command) with or without data to the memory device. At time t2, in response to the program command, the memory device begins an erase suspend operation (e.g., without receiving a suspend command). Between times t2 and t3, the memory device may wait until an execution breakpoint is reached, suspend the execution of the erase operation at the execution breakpoint, and prepare the memory device to execute the program operation.

At time t3, the program operation has been suspended and the ready/busy control signal is released to indicate the memory device is ready to receive other program commands. In response to the release of the ready/busy control signal, the host device requests a status check of the memory device. The status check may poll a status register (e.g., 122 of FIG. 1) of the memory device to determine whether the erase operation was suspended. At time t4, in response to a successful status check, the memory device transmits another program command (or data for the program command at time t1) to the memory device. At time t5, in response to the program command (or data), the memory device begins the execution of the program operation and pulls down the ready/busy control signal to indicate that the memory device is busy executing the program operation. Once the program operation is complete, the erase operation may be resumed in response to an erase resume command as illustrated in FIG. 6A or automatically as illustrated in FIG. 6B.

FIGS. 7A-7D are flowcharts of a method 700 of operating a memory in accordance with an embodiment. Method 700 may correspond at least in part to FIGS. 4A-4C. For example, FIG. 7A-7D might represent a method of suspending a program operation to perform a read operation, and resuming the program operation once the read operation is complete. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 7A:
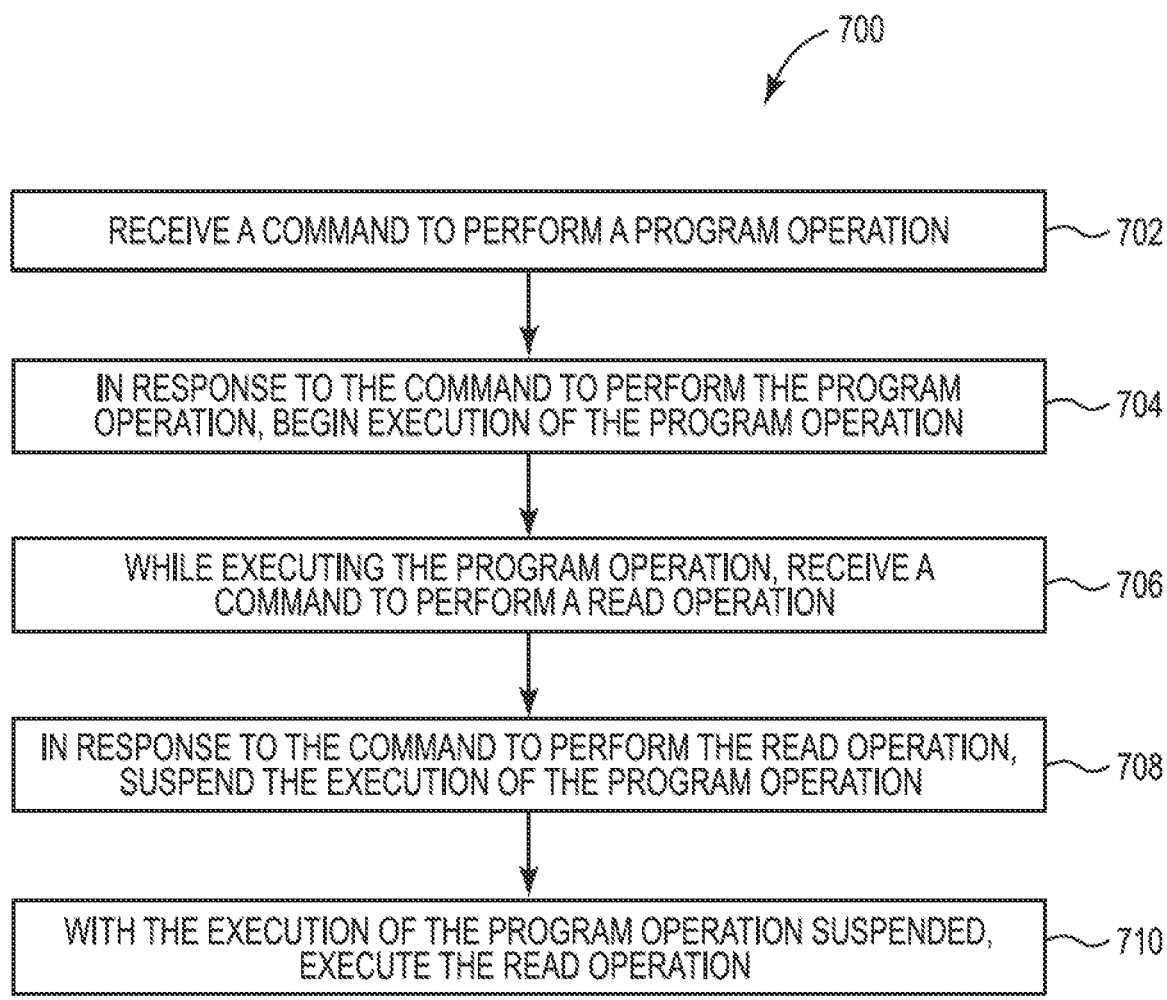
FIGS. 7A-7D are flowcharts of a method of operating a memory in accordance with an embodiment.

Method 700 might be implemented within a memory device (e.g., 100) including an array of memory cells (e.g., 104) and a controller (e.g., 116) configured to access the array of memory cells as previously described at least with reference to FIGS. 1-2C. As illustrated in FIG. 7A at 702, the controller may receive a command to perform a program operation. At 704, the controller may in response to the command to perform the program operation, begin execution of the program operation. At 706, the controller may while executing the program operation, receive a command to perform a read operation. The command to perform the read operation may include a read parameter page command, a read unique ID command, a set feature command, a get feature command, a read page multi-plane command, an iWL read command, or another suitable read command.

At 708, the controller may in response to the command to perform the read operation, suspend the execution of the program operation. In one example, the controller may suspend the execution of the program operation without receiving a suspend command. At 710, the controller may with the execution of the program operation suspended, execute the read operation. In one example, the controller may further in response to the execution of the read operation completing, resume the execution of the program operation without receiving a resume command. An another example, the controller may further in response to the execution of the read operation completing, resume the execution of the program operation in response to receiving a resume command.

Figure 7B:
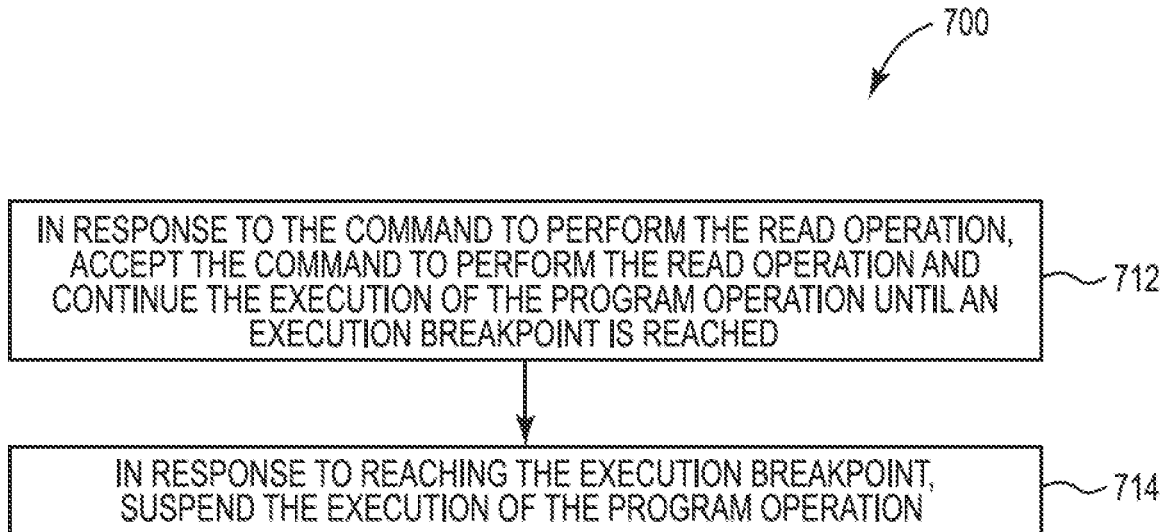

As illustrated in FIG. 7B at 712, the controller may further in response to the command to perform the read operation, accept the command to perform the read operation and continue the execution of the program operation until an execution breakpoint is reached. At 714, the controller may further in response to reaching the execution breakpoint, suspend the execution of the program operation.

Figure 7C:
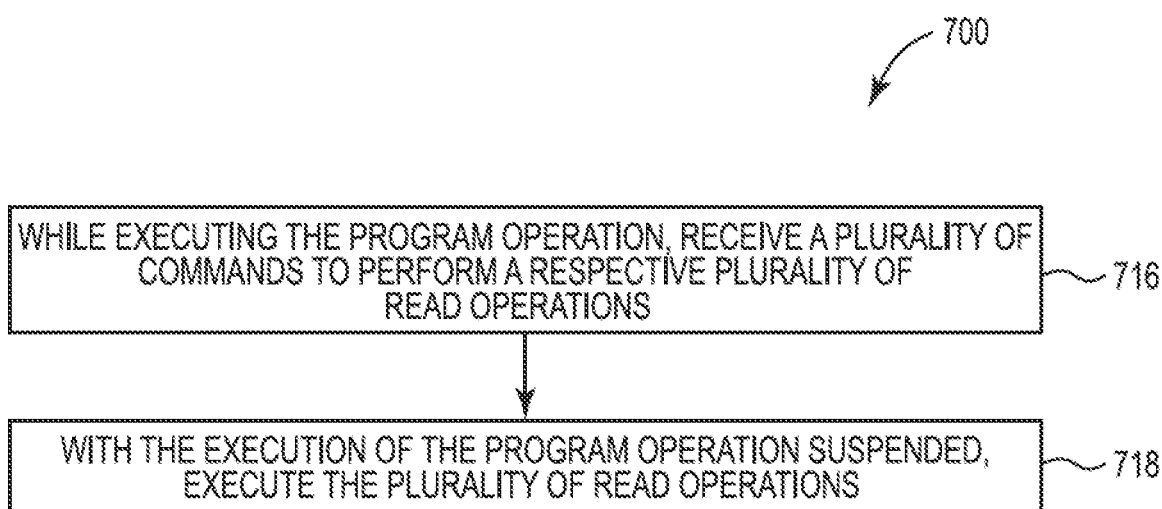

As illustrated in FIG. 7C at 716, the controller may further while executing the program operation, receive a plurality of commands to perform a respective plurality of read operations. At 718, the controller may further with the execution of the program operation suspended, execute the plurality of read operations. In this embodiment, the memory device may further include a command register (e.g., 124 of FIG. 1) to latch the plurality of commands to perform the respective plurality of read operations in the order they are received. As such, the controller may further execute the plurality of read operations in the order they were received.

Figure 7D:
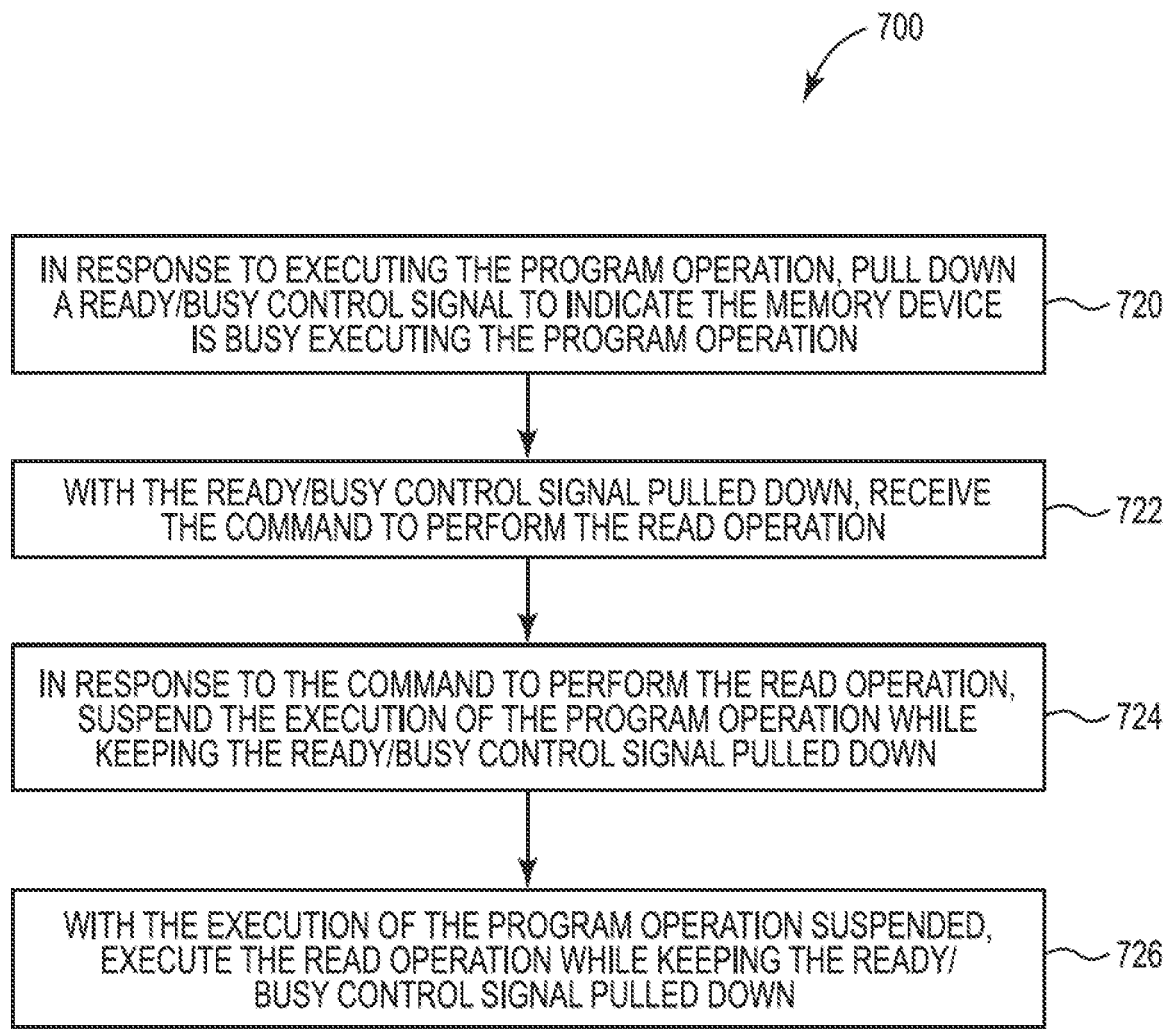

As illustrated in FIG. 7D at 720, the controller may further in response to executing the program operation, pull down a ready/busy control signal to indicate the memory device is busy executing the program operation. At 722, the controller may further with the ready/busy control signal pulled down, receive the command to perform the read operation. At 724, the controller may further in response to the command to perform the read operation, suspend the execution of the program operation while keeping the ready/busy control signal pulled down. At 726, the controller may further with the execution of the program operation suspended, execute the read operation while keeping the ready/busy control signal pulled down.

FIGS. 8A-8D are flowcharts of a method 800 of operating a memory in accordance with another embodiment. Method 800 may correspond at least in part to FIGS. 5A-5C. For example, FIG. 8A-8D might represent a method of suspending an erase operation to perform a read operation, and resuming the erase operation once the read operation is complete. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 8A:
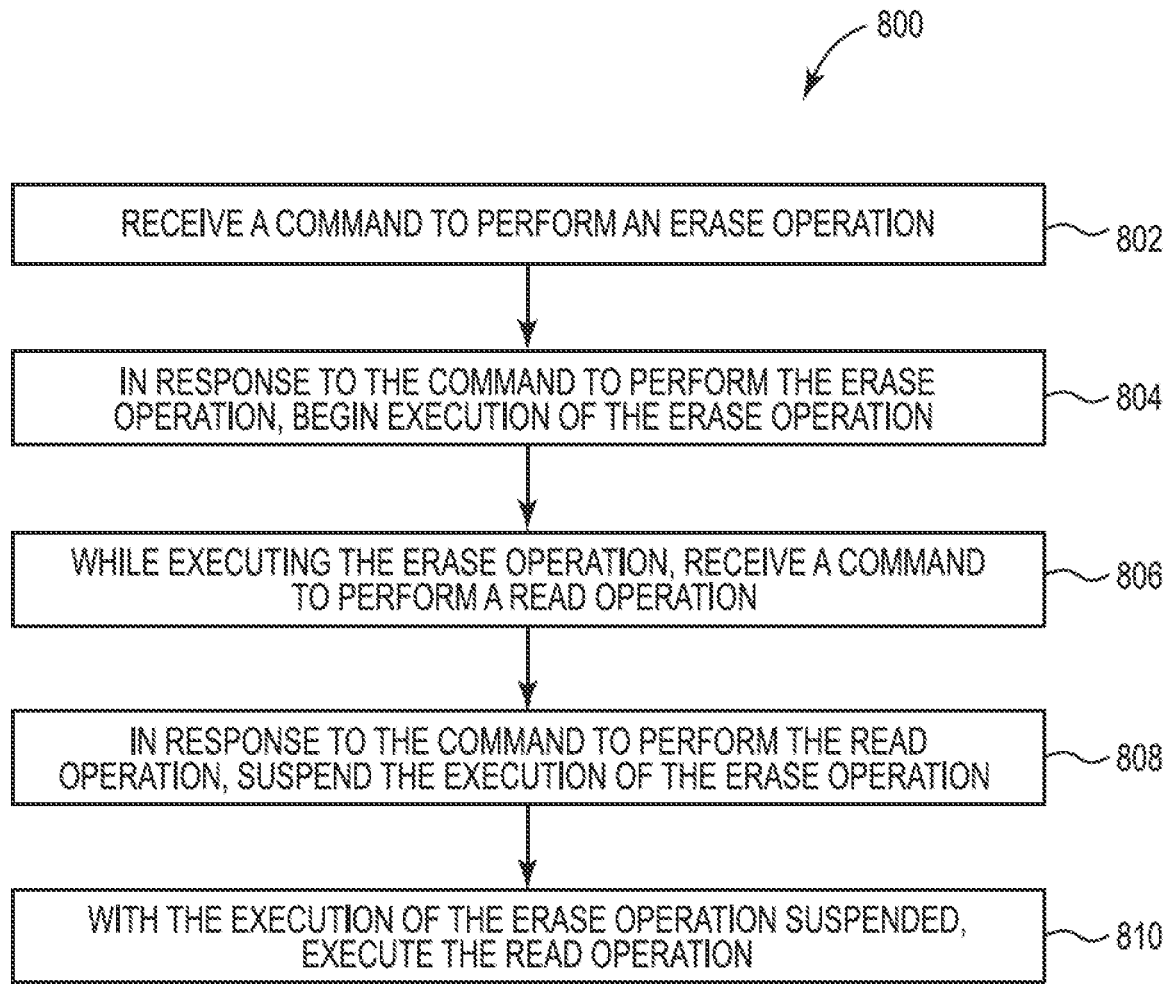
FIGS. 8A-8D are flowcharts of a method of operating a memory in accordance with another embodiment.

Method 800 might be implemented within a memory device (e.g., 100) including an array of memory cells (e.g., 104) and a controller (e.g., 116) configured to access the array of memory cells as previously described at least with reference to FIGS. 1-2C. As illustrated in FIG. 8A at 802, the controller may receive a command to perform an erase operation. At 804, the controller may in response to the command to perform the erase operation, begin execution of the erase operation. At 806, the controller may while executing the erase operation, receive a command to perform a read operation. The command to perform the read operation may include a read parameter page command, a read unique ID command, a set feature command, a get feature command, a read page multi-plane command, an iWL read command, a program multi-plane command, a cache read command, a copyback command, or another suitable read command.

At 808, the controller may in response to the command to perform the read operation, suspend the execution of the erase operation. In one example, the controller may suspend the execution of the erase operation without receiving a suspend command. At 810, the controller may with the execution of the erase operation suspended, execute the read operation. In one example, the controller may further in response to the execution of the read operation completing, resume the execution of the erase operation without receiving a resume command. In another example, the controller may further in response to the execution of the read operation completing, resume the execution of the erase operation in response to receiving a resume command.

Figure 8B:
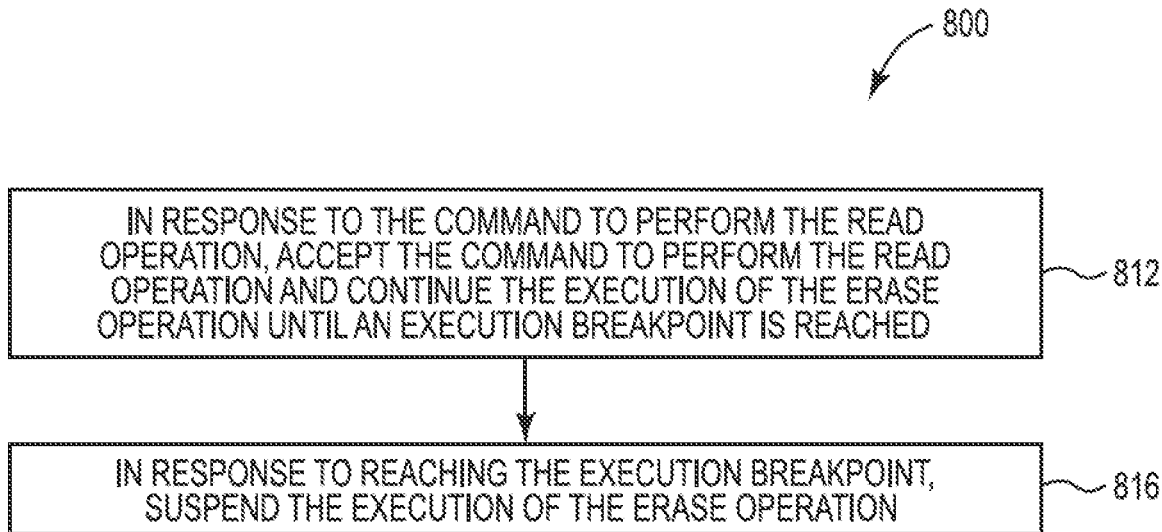

As illustrated in FIG. 8B at 812, the controller may further in response to the command to perform the read operation, accept the command to perform the read operation and continue the execution of the erase operation until an execution breakpoint is reached. At 816, the controller may further in response to reaching the execution breakpoint, suspend the execution of the erase operation.

Figure 8C:
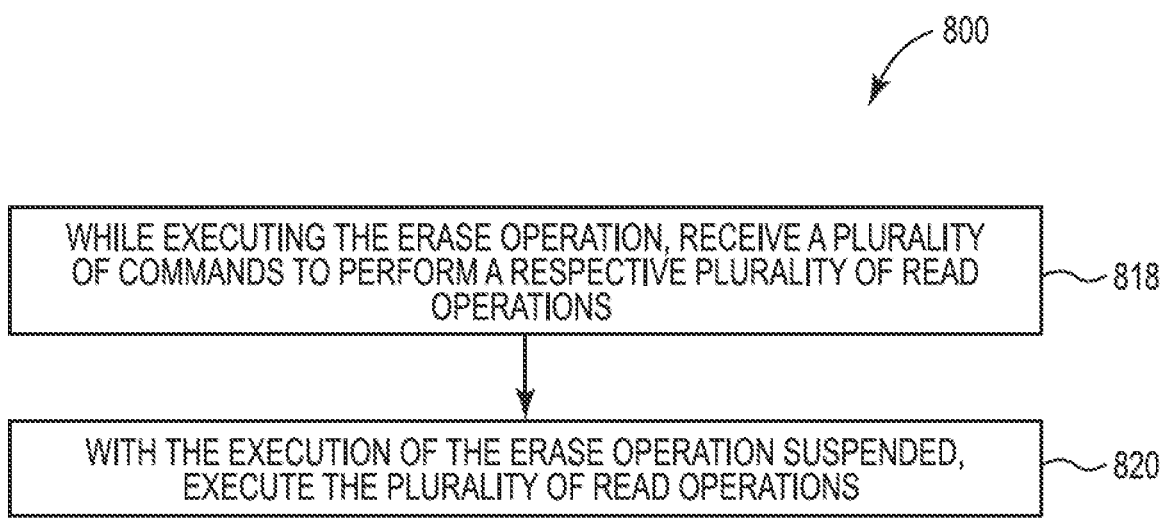

As illustrated in FIG. 8C at 818, the controller may further while executing the erase operation, receive a plurality of commands to perform a respective plurality of read operations. At 820, the controller may further with the execution of the erase operation suspended, execute the plurality of read operations. In this embodiment, the memory device may further include a command register (e.g., 124 of FIG. 1) to latch the plurality of commands to perform the respective plurality of read operations in the order they are received. As such, the controller may further execute the plurality of read operations in the order they were received.

Figure 8D:
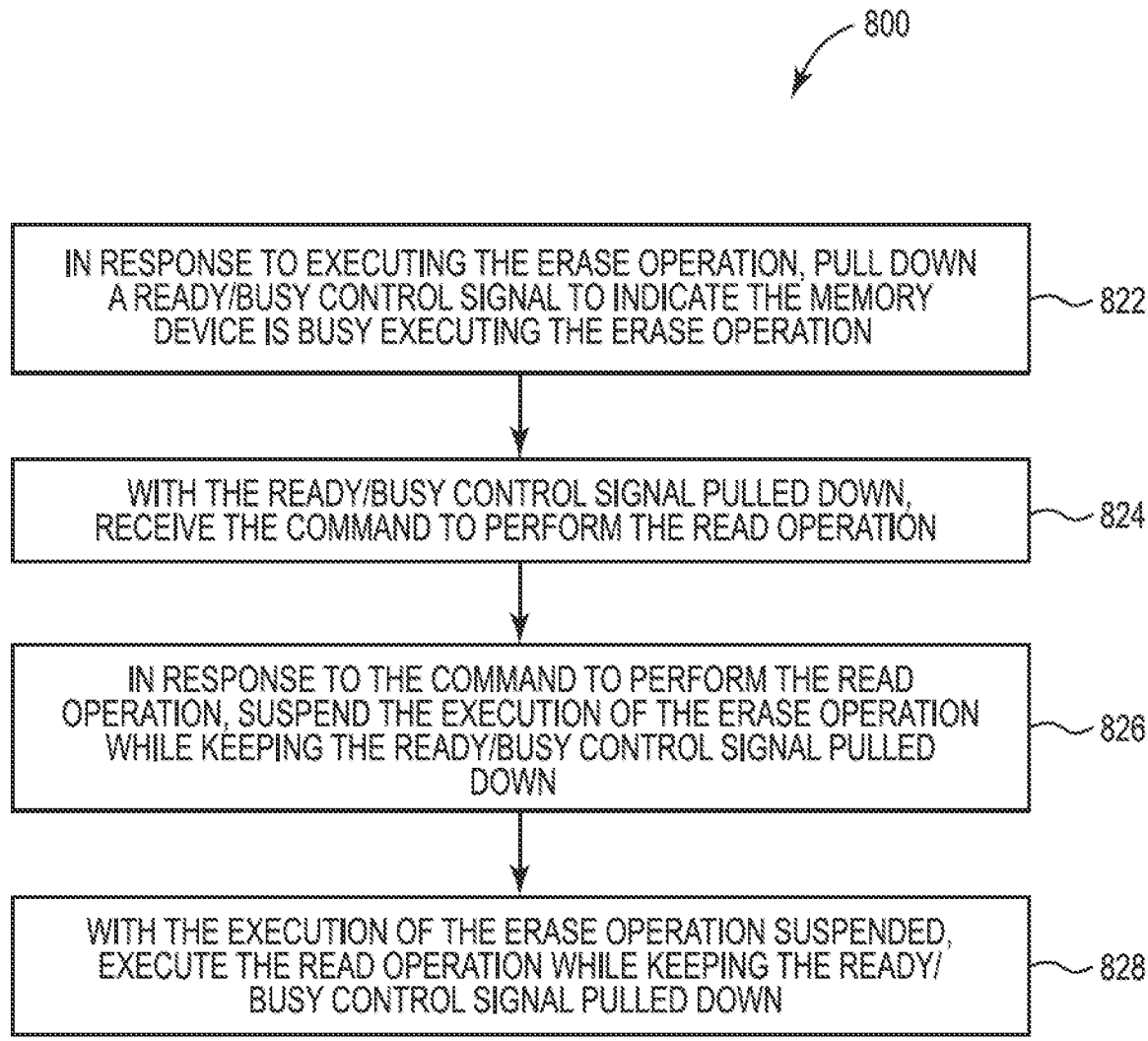

As illustrated in FIG. 8D at 822, the controller may further in response to executing the erase operation, pull down a ready/busy control signal to indicate the memory device is busy executing the erase operation. At 824, the controller may further with the ready/busy control signal pulled down, receive the command to perform the read operation. At 826, the controller may further in response to the command to perform the read operation, suspend the execution of the erase operation while keeping the ready/busy control signal pulled down. At 828, the controller may further with the execution of the erase operation suspended, execute the read operation while keeping the ready/busy control signal pulled down.

FIGS. 9A-9D are flowcharts of a method 900 of operating a memory in accordance with another embodiment. Method 900 may correspond at least in part to FIGS. 4A-4C. For example, FIG. 9A-9D might represent a method of suspending a program operation to perform a read operation, and resuming the program operation once the read operation is complete. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 9A:
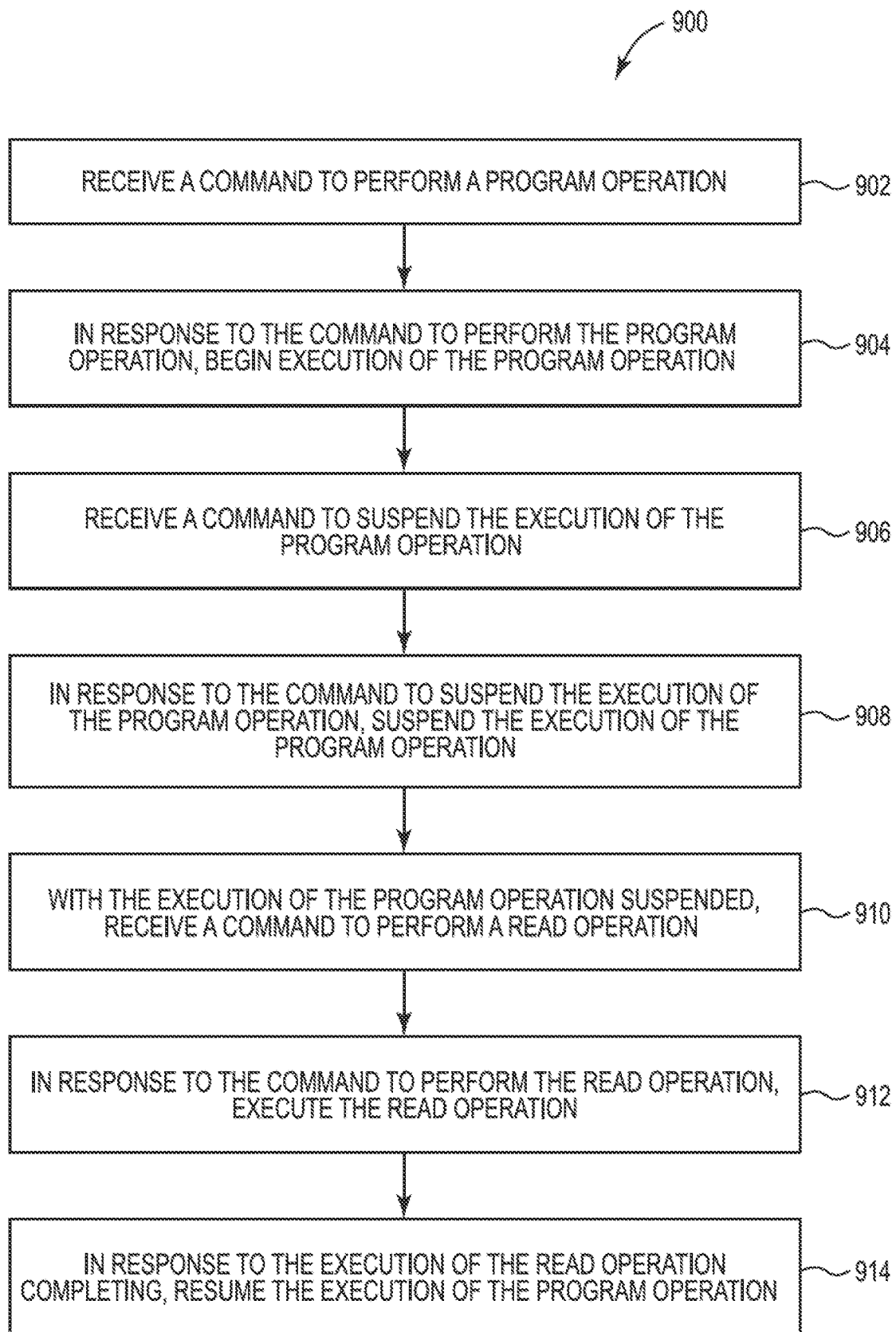
FIGS. 9A-9D are flowcharts of a method of operating a memory in accordance with another embodiment.

Method 900 might be implemented within a memory device (e.g., 100) including an array of memory cells (e.g., 104) and a controller (e.g., 116) configured to access the array of memory cells as previously described at least with reference to FIGS. 1-2C. As illustrated in FIG. 9A at 902, the controller may receive a command to perform a program operation. At 904, the controller may in response to the command to perform the program operation, begin execution of the program operation. At 906, the controller may receive a command to suspend the execution of the program operation. At 908, the controller may in response to the command to suspend the execution of the program operation, suspend the execution of the program operation. At 910, the controller may with the execution of the program operation suspended, receive a command to perform a read operation. The command to perform the read operation may include a read parameter page command, a read unique ID command, a set feature command, a get feature command, a read page multi-plane command, an iWL read command, or another suitable read command. At 912, the controller may in response to the command to perform the read operation, execute the read operation. At 914, the controller may in response to the execution of the read operation completing, resume the execution of the program operation. The controller may resume the execution of the program operation without receiving a resume command.

Figure 9B:
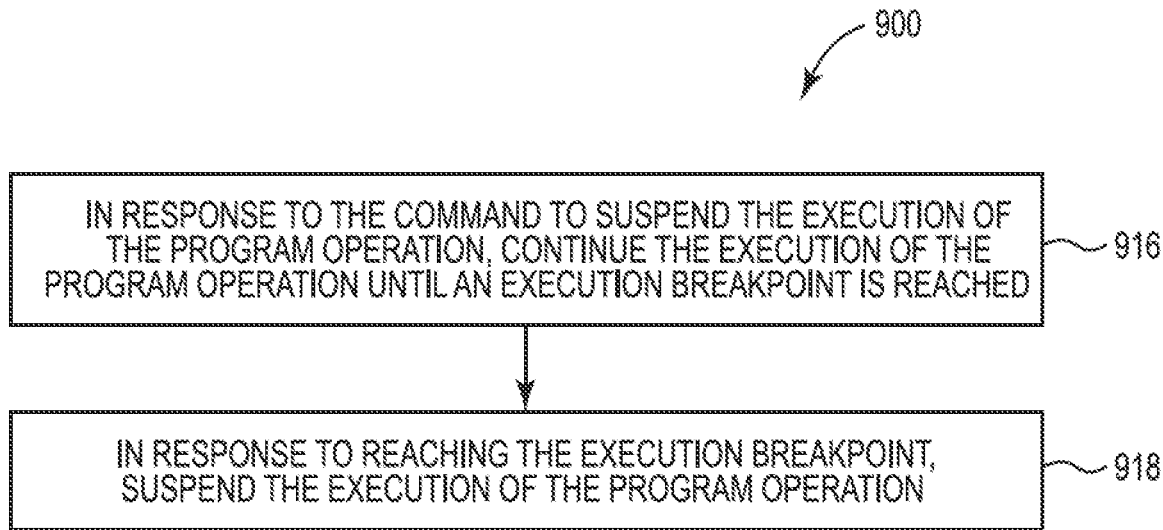

As illustrated in FIG. 9B at 916, the controller may further in response to the command to suspend the execution of the program operation, continue the execution of the program operation until an execution breakpoint is reached. At 918, the controller may further in response to reaching the execution breakpoint, suspend the execution of the program operation.

Figure 9C:
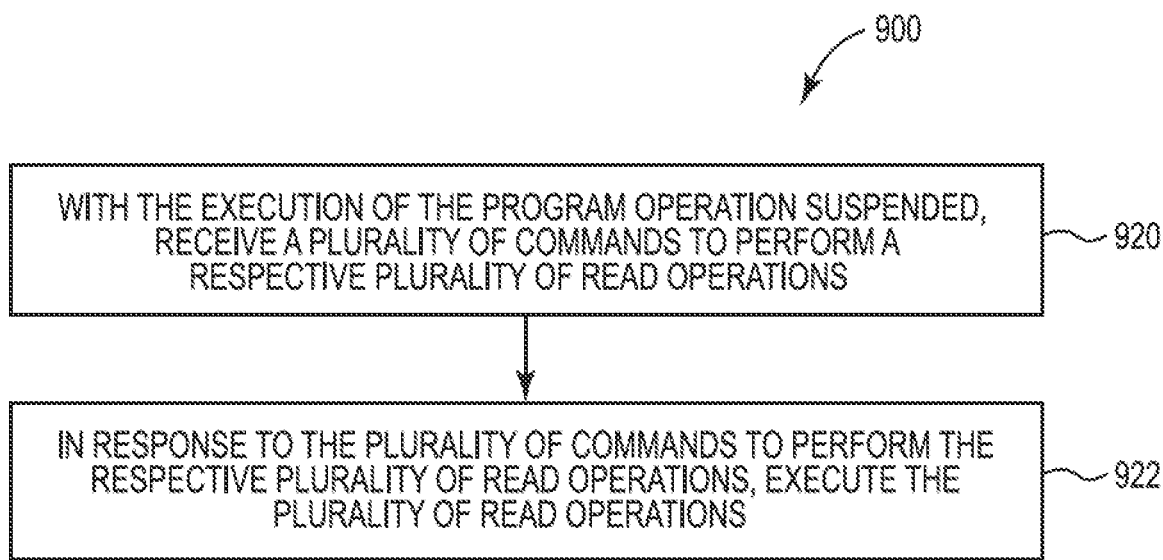

As illustrated in FIG. 9C at 920, the controller may further with the execution of the program operation suspended, receive a plurality of commands to perform a respective plurality of read operations. At 922, the controller may further in response to the plurality of commands to perform the respective plurality of read operations, execute the plurality of read operations. In this embodiment, the memory device may further include a command register (e.g., 124 of FIG. 1) to latch the plurality of commands to perform the respective plurality of read operations in the order they are received. As such, the controller may further execute the plurality of read operations in the order they were received.

Figure 9D:
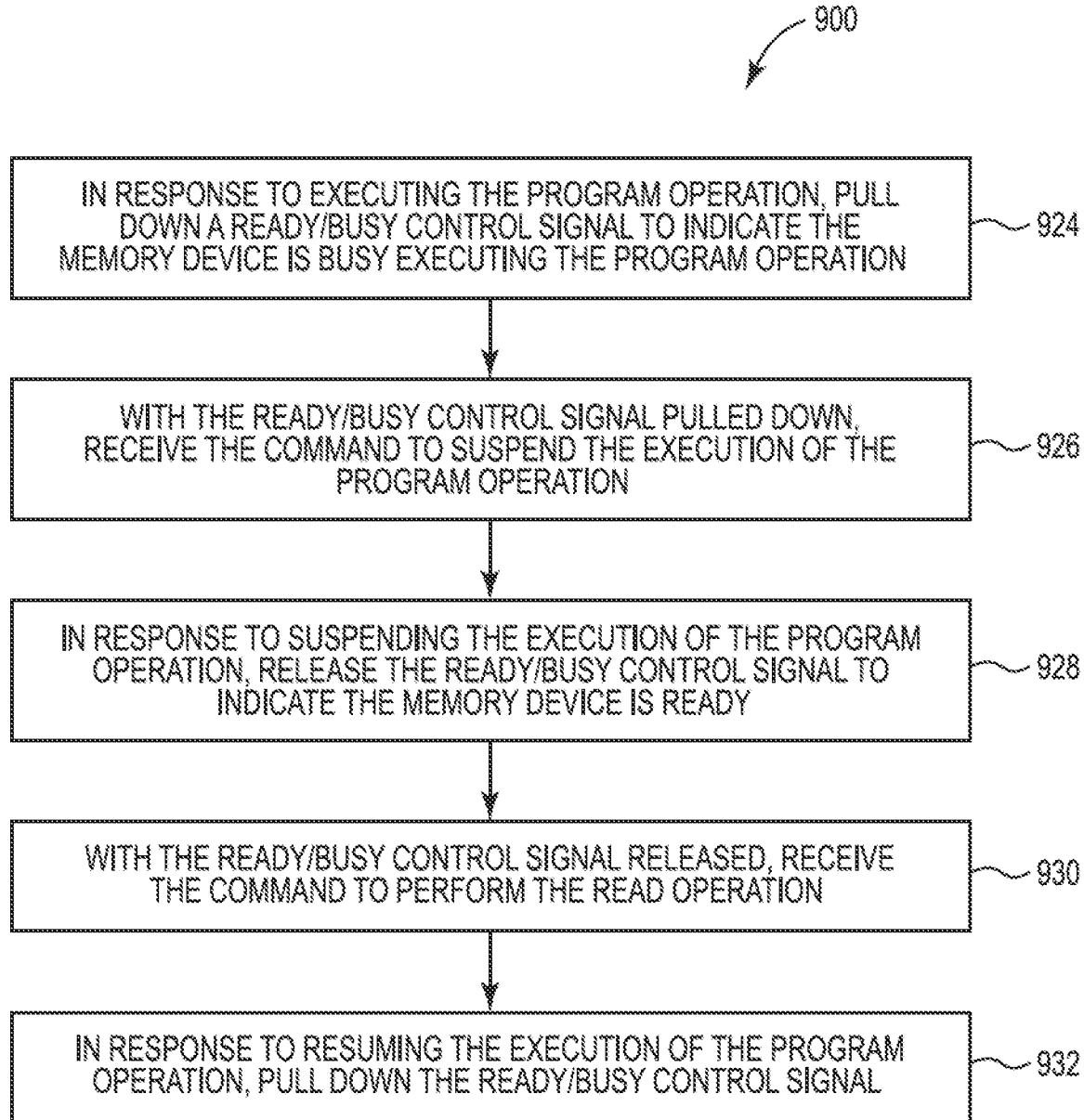

As illustrated in FIG. 9D at 924, the controller may further in response to executing the program operation, pull down a ready/busy control signal to indicate the memory device is busy executing the program operation. At 926, the controller may further with the ready/busy control signal pulled down, receive the command to suspend the execution of the program operation. At 928, the controller may further in response to suspending the execution of the program operation, release the ready/busy control signal to indicate the memory device is ready. At 930, the controller may further with the ready/busy control signal released, receive the command to perform the read operation. At 932, the controller may further in response to resuming the execution of the program operation, pull down the ready/busy control signal.

FIGS. 10A-10D are flowcharts of a method 1000 of operating a memory in accordance with another embodiment. Method 1000 may correspond at least in part to FIGS. 5A-5C. For example, FIG. 10A-10D might represent a method of suspending an erase operation to perform a read operation, and resuming the erase operation once the read operation is complete. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 10A:
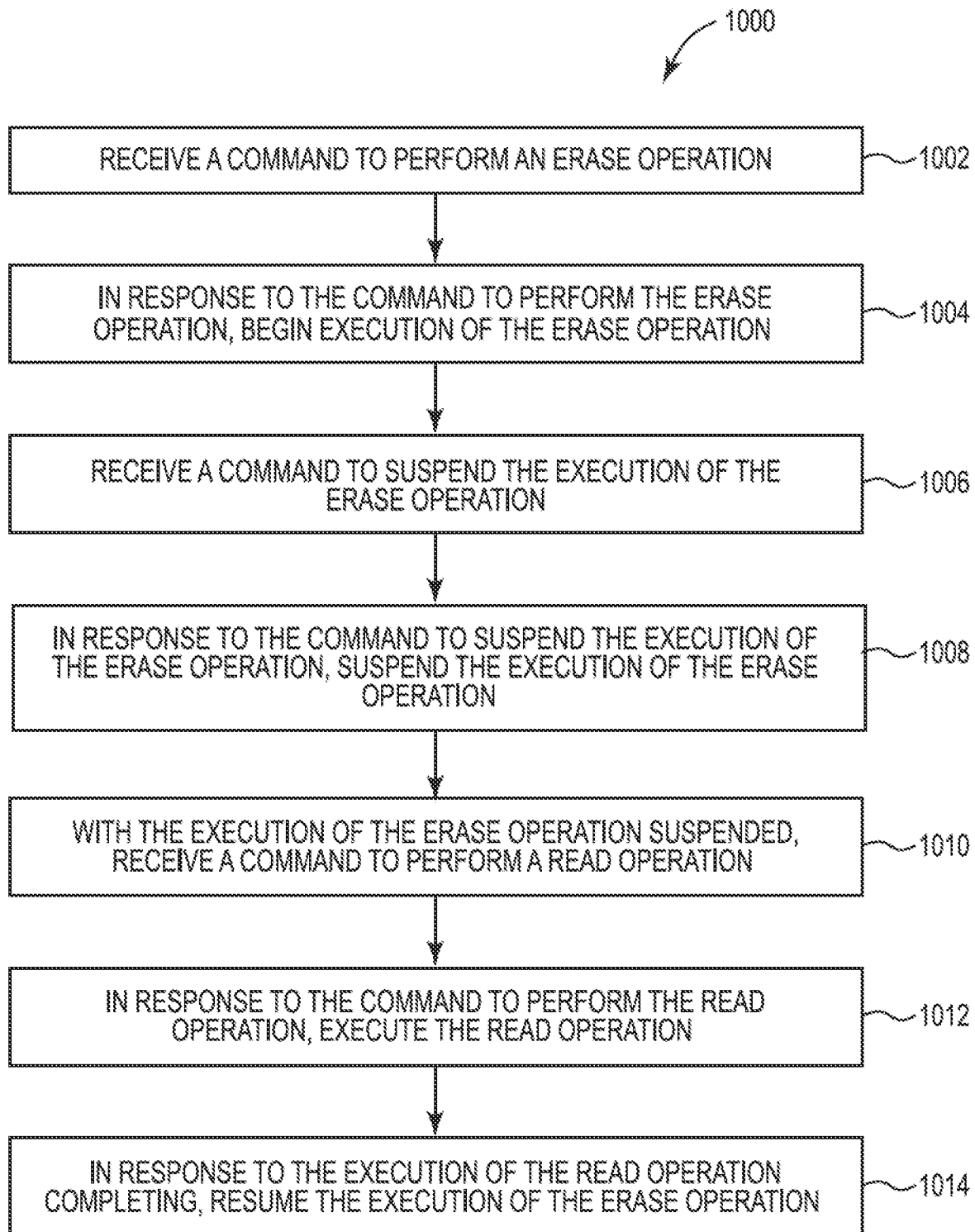
FIGS. 10A-10D are flowcharts of a method of operating a memory in accordance with another embodiment.

Method 1000 might be implemented within a memory device (e.g., 100) including an array of memory cells (e.g., 104) and a controller (e.g., 116) configured to access the array of memory cells as previously described at least with reference to FIGS. 1-2C. As illustrated in FIG. 10A at 1002, the controller may receive a command to perform an erase operation. At 1004, the controller may in response to the command to perform the erase operation, begin execution of the erase operation. At 1006, the controller may receive a command to suspend the execution of the erase operation. At 1008, the controller may in response to the command to suspend the execution of the erase operation, suspend the execution of the erase operation. At 1010, the controller may with the execution of the erase operation suspended, receive a command to perform a read operation. The command to perform the read operation may include a read parameter page command, a read unique ID command, a set feature command, a get feature command, a read page multi-plane command, an iWL read command, a cache read command, a copyback command, or another suitable read command. At 1012, the controller may in response to the command to perform the read operation, execute the read operation. At 1014, the controller may in response to the execution of the read operation completing, resume the execution of the erase operation. The controller may resume the execution of the erase operation without receiving a resume command.

Figure 10B:
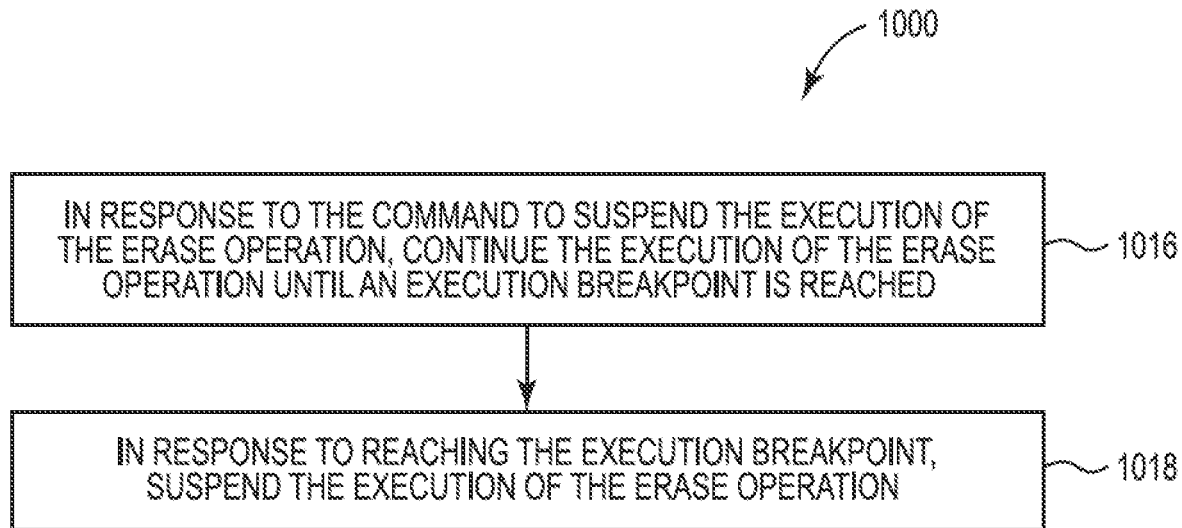

As illustrated in FIG. 10B at 1016, the controller may further in response to the command to suspend the execution of the erase operation, continue the execution of the erase operation until an execution breakpoint is reached. At 1018, the controller may further in response to reaching the execution breakpoint, suspend the execution of the erase operation.

Figure 10C:
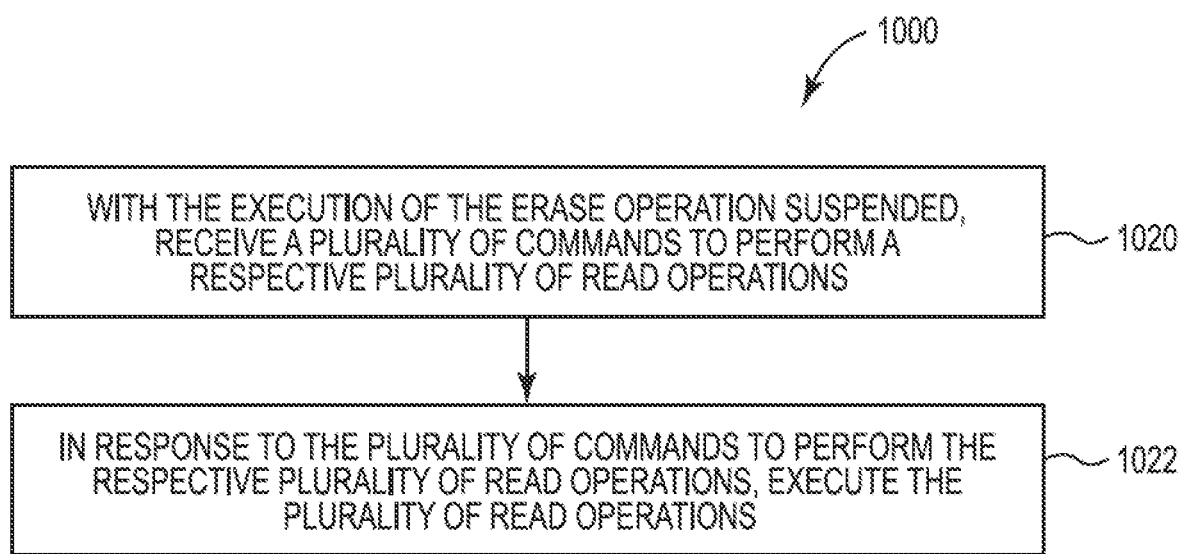

As illustrated in FIG. 10C at 1020, the controller may further with the execution of the erase operation suspended, receive a plurality of commands to perform a respective plurality of read operations. At 1022, the controller may further in response to the plurality of commands to perform the respective plurality of read operations, execute the plurality of read operations. In this embodiment, the memory device may further include a command register (e.g., 124 of FIG. 1) to latch the plurality of commands to perform the respective plurality of read operations in the order they are received. As such, the controller may further execute the plurality of read operations in the order they were received.

Figure 10D:
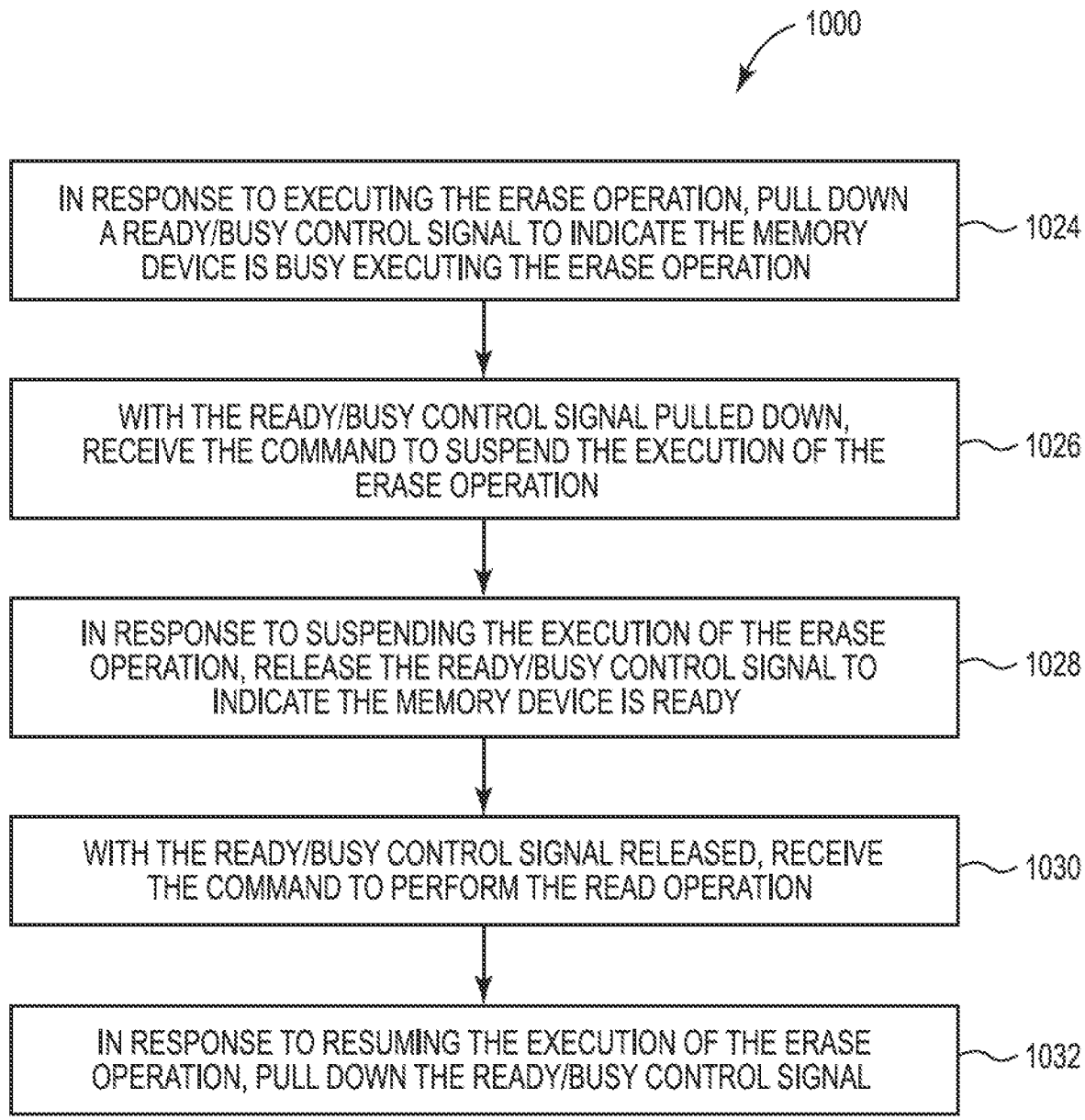

As illustrated in FIG. 10D at 1024, the controller may further in response to executing the erase operation, pull down a ready/busy control signal to indicate the memory device is busy executing the erase operation. At 1026, the controller may further with the ready/busy control signal pulled down, receive the command to suspend the execution of the erase operation. At 1028, the controller may further in response to suspending the execution of the erase operation, release the ready/busy control signal to indicate the memory device is ready. At 1030, the controller may further with the ready/busy control signal released, receive the command to perform the read operation. At 1032, the controller may further in response to resuming the execution of the erase operation, pull down the ready/busy control signal.

FIGS. 11A-11G are flowcharts of a method 1100 of operating a memory in accordance with another embodiment. Method 1100 may correspond at least in part to FIGS. 6A-6E. For example, FIG. 11A-11D might represent a method of suspending an erase operation to perform a program operation, and resuming the erase operation once the program operation is complete. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 11A:
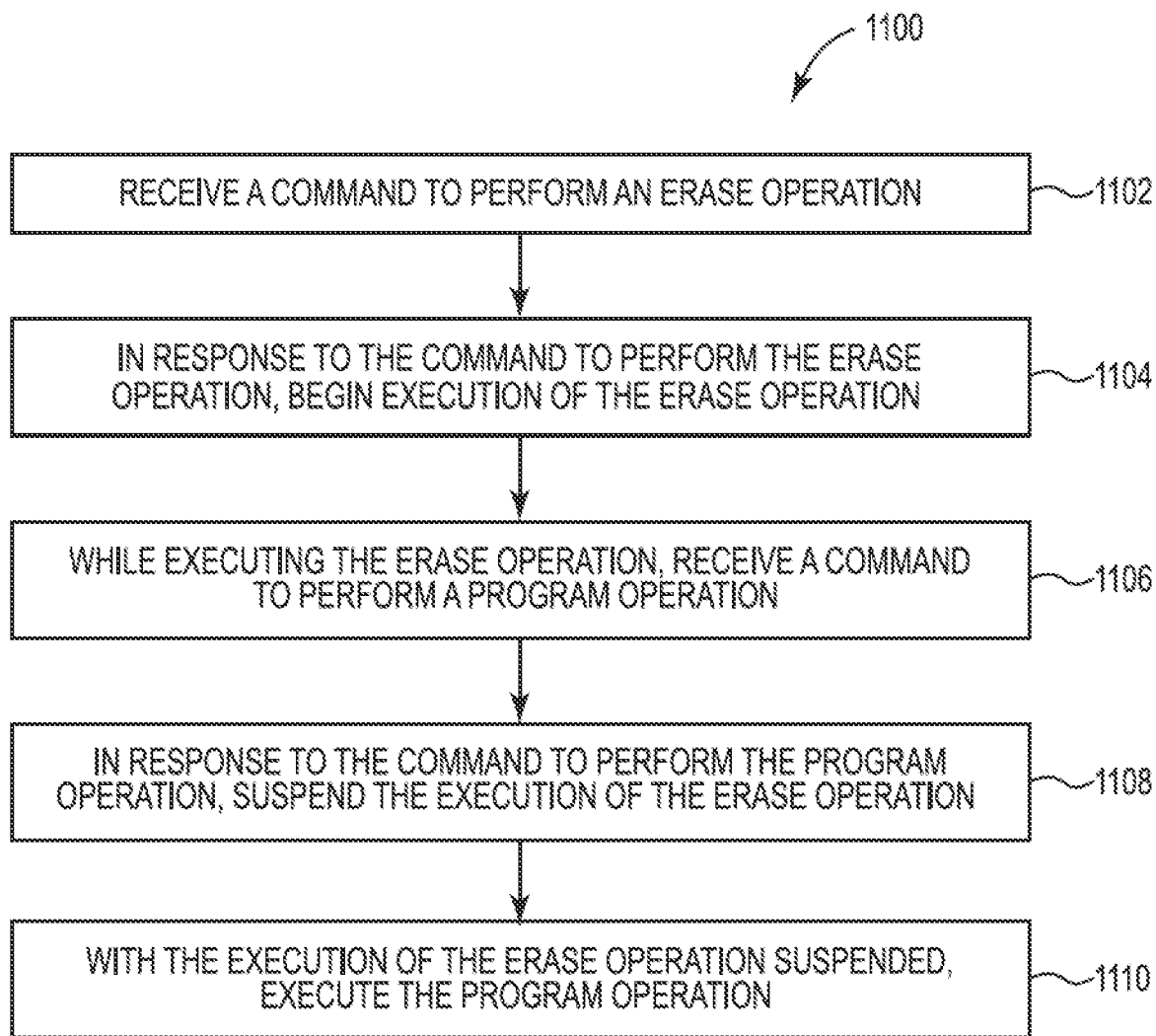
FIGS. 11A-11G are flowcharts of a method of operating a memory in accordance with another embodiment.

Method 1100 might be implemented within a memory device (e.g., 100) including an array of memory cells (e.g., 104) and a controller (e.g., 116) configured to access the array of memory cells as previously described at least with reference to FIGS. 1-2C. As illustrated in FIG. 11A at 1102, the controller may receive a command to perform an erase operation. At 1104, the controller may in response to the command to perform the erase operation, begin execution of the erase operation. At 1106, the controller may while executing the erase operation, receive a command to perform a program operation. The command to perform a program operation may include an initial program command, a final program confirm command, a multi-plane program confirm command, a cache program confirm command, or another suitable program command.

At 1108, the controller may in response to the command to perform the program operation, suspend the execution of the erase operation. The controller may suspend the execution of the erase operation without receiving a suspend command. At 1110, the controller may with the execution of the erase operation suspended, execute the program operation. In one example, the controller may in response to the execution of the program operation completing, resume the execution of the erase operation without receiving a resume command. In another example, the controller may in response to the execution of the program operation completing, resume the execution of the erase operation in response to receiving a resume command.

Figure 11B:
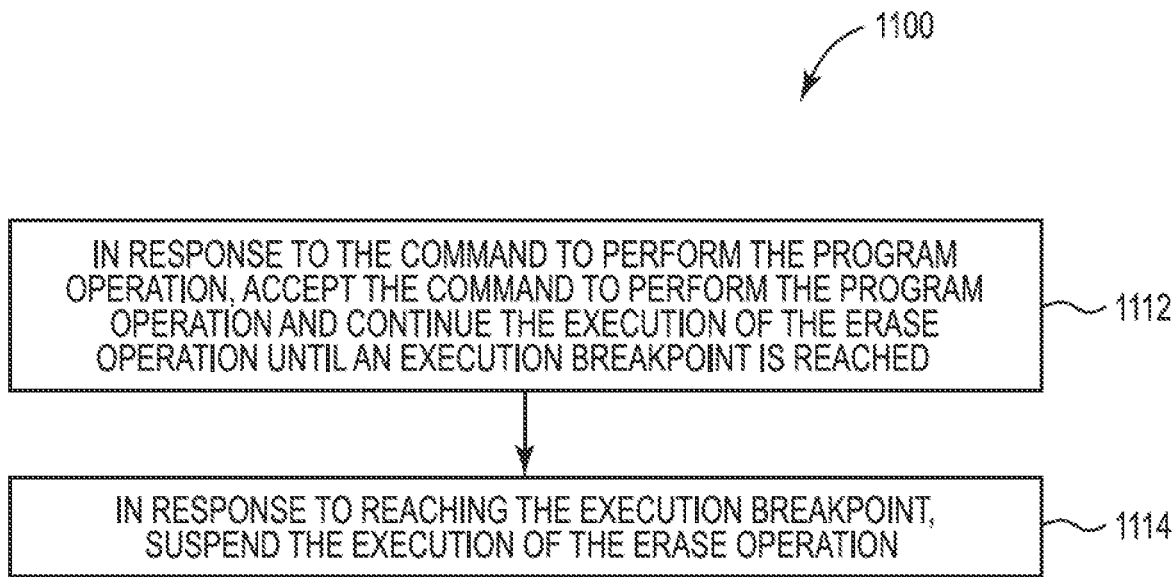

As illustrated in FIG. 11B at 1112, the controller may further in response to the command to perform the program operation, accept the command to perform the program operation and continue the execution of the erase operation until an execution breakpoint is reached. At 1114, the controller may further in response to reaching the execution breakpoint, suspend the execution of the erase operation.

Figure 11C:
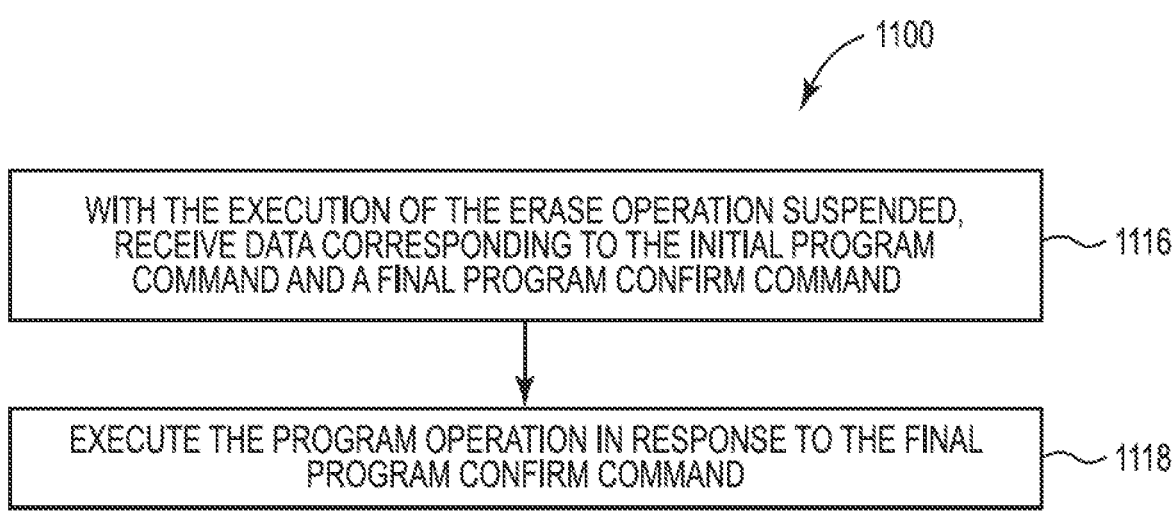

As illustrated in FIG. 11C at 1116, the controller may further with the execution of the erase operation suspended, receive data corresponding to the initial program command and a final program confirm command. At 1118, the controller may further execute the program operation in response to the final program confirm command.

Figure 11D:
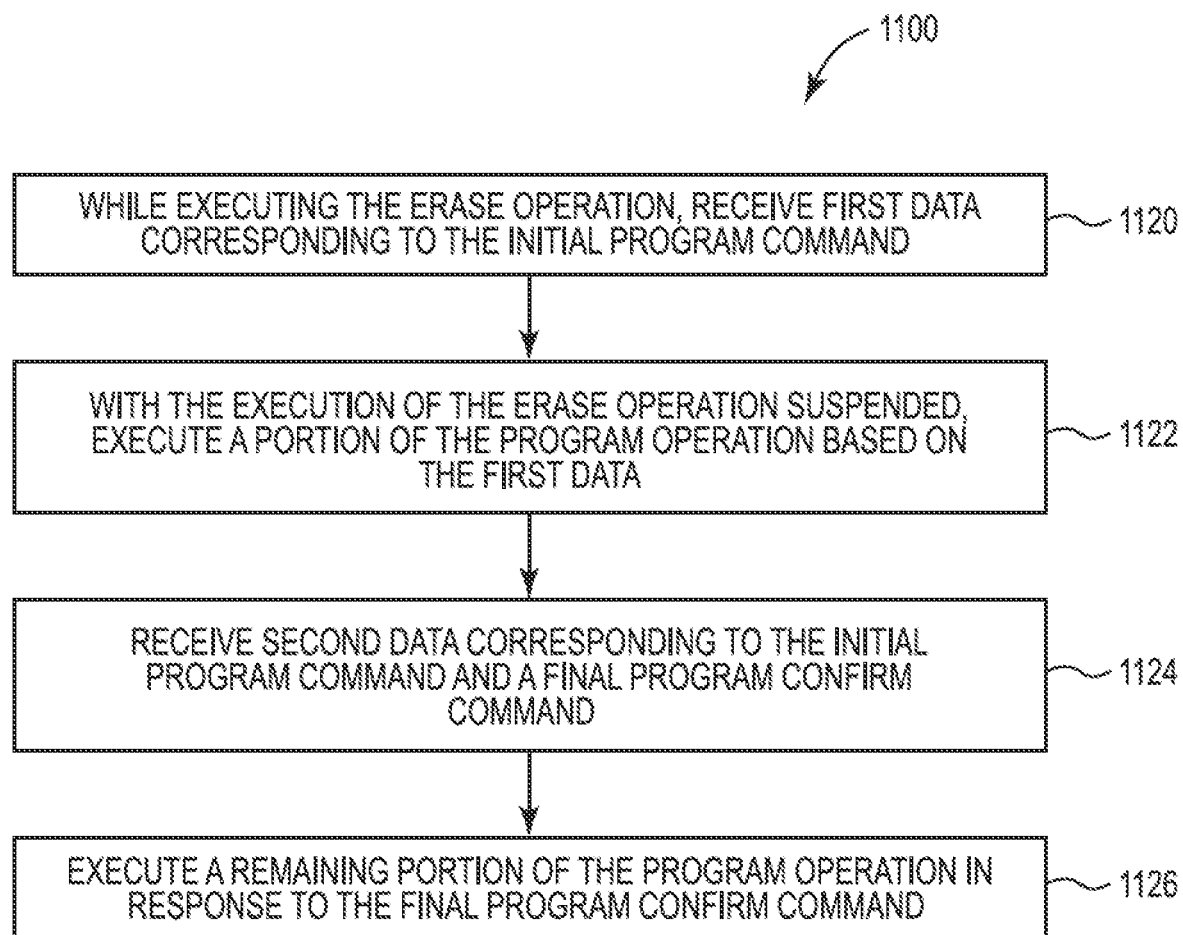

As illustrated in FIG. 11D at 1120, the controller may further while executing the erase operation, receive first data corresponding to the initial program command. At 1122, the controller may further with the execution of the erase operation suspended, execute a portion of the program operation based on the first data. At 1124, the controller may further receive second data corresponding to the initial program command and a final program confirm command. At 1126, the controller may further execute a remaining portion of the program operation in response in the final program confirm command.

Figure 11E:
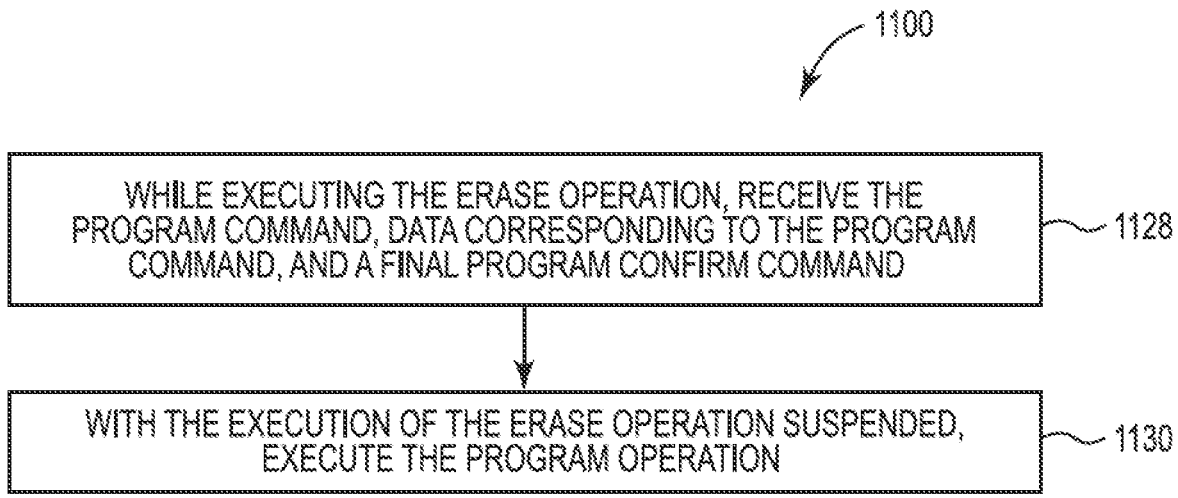

As illustrated in FIG. 11E at 1128, the controller may further while executing the erase operation, receive the program command, data corresponding to the program command, and a final program confirm command. At 1130, the controller may further with the execution of the erase operation suspended, execute the program operation.

Figure 11F:
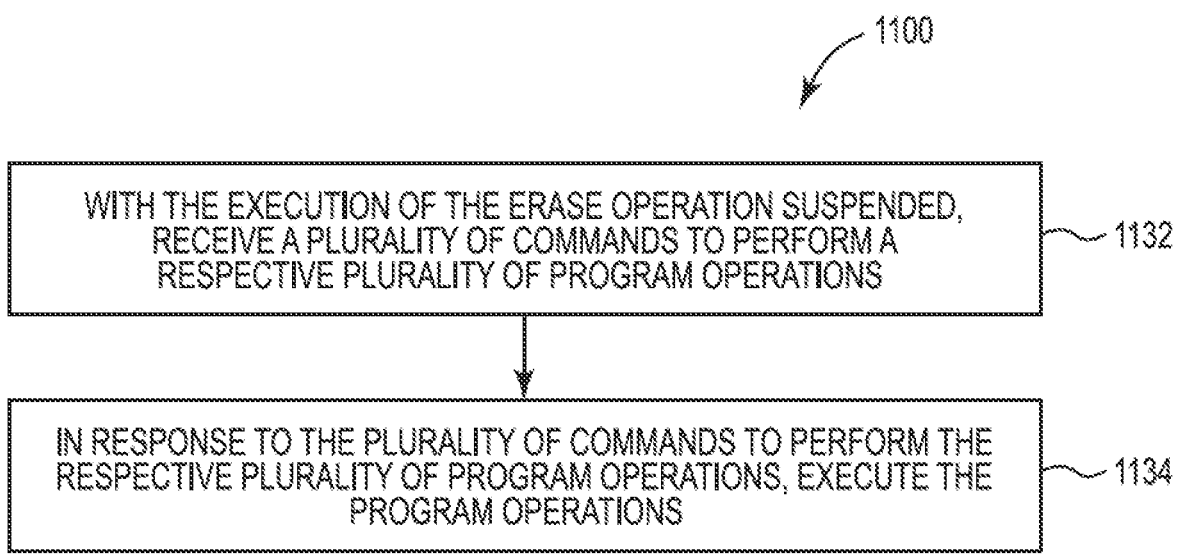

As illustrated in FIG. 11F at 1132, the controller may further with the execution of the erase operation suspended, receive a plurality of commands to perform a respective plurality of program operations. At 1134, the controller may further in response to the plurality of commands to perform the respective plurality of program operations, execute the plurality of program operations. In this embodiment, the memory device may further include a command register (e.g., 124 of FIG. 1) to latch the plurality of commands to perform the respective plurality of program operations in the order they are received. As such, the controller may further execute the plurality of program operations in the order they were received.

Figure 11G:
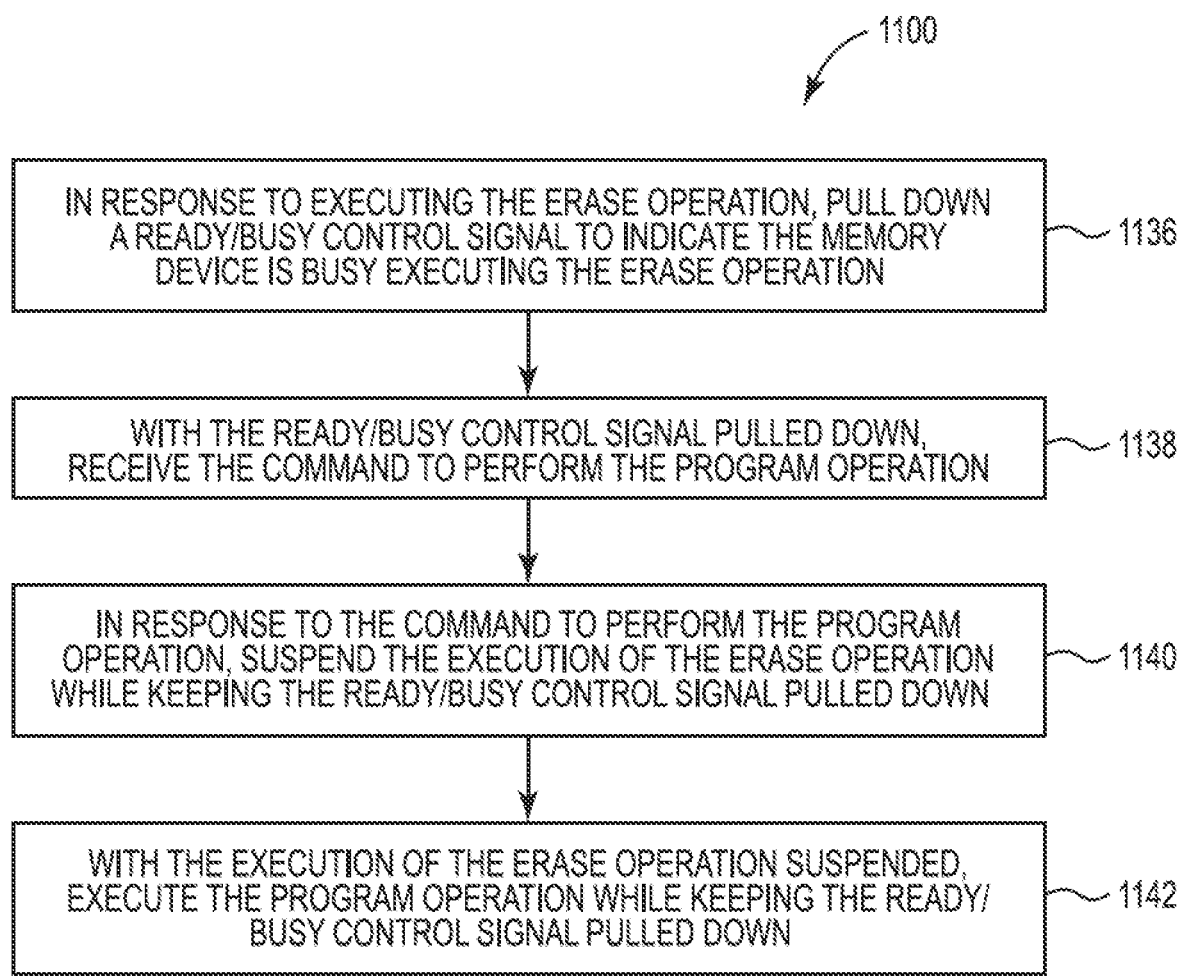

As illustrated in FIG. 11G at 1136, the controller may further in response to executing the erase operation, pull down a ready/busy control signal to indicate the memory device is busy executing the erase operation. At 1138, the controller may further with the ready/busy control signal pulled down, receive the command to perform the program operation. At 1140, the controller may further in response to the command to perform the program operation, suspend the execution of the erase operation while keeping the ready/busy control signal pulled down. At 1142, the controller may further with the execution of the erase operation suspended, execute the program operation while keeping the ready/busy control signal pulled down.

FIGS. 12A-12D are flowcharts of a method 1200 of operating a memory in accordance with another embodiment. Method 1200 may correspond at least in part to FIGS. 6A-6E. For example, FIG. 12A-12D might represent a method of suspending an erase operation to perform a program operation, and resuming the erase operation once the program operation is complete. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 12A:
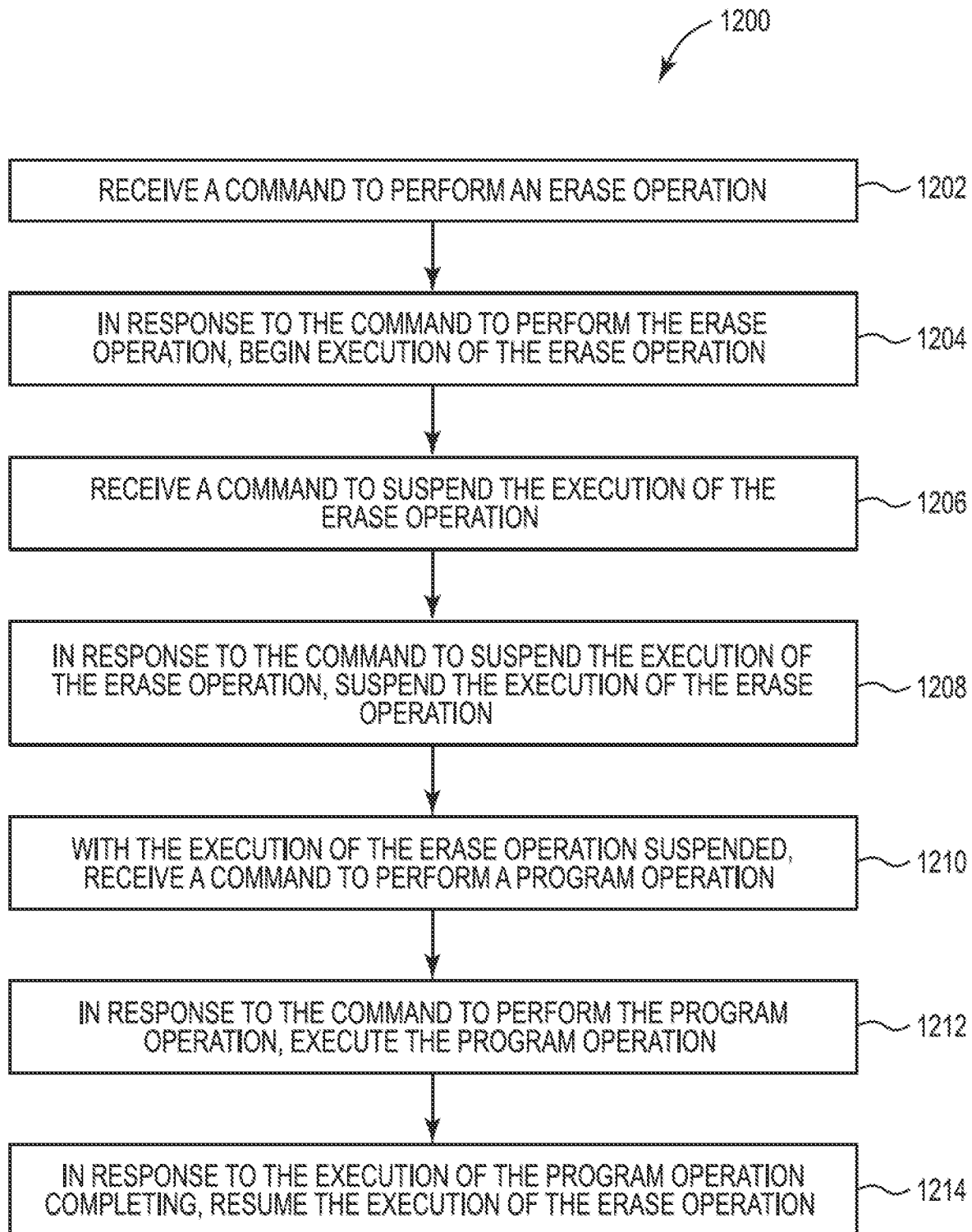
FIGS. 12A-12D are flowcharts of a method of operating a memory in accordance with another embodiment.

Method 1200 might be implemented within a memory device (e.g., 100) including an array of memory cells (e.g., 104) and a controller (e.g., 116) configured to access the array of memory cells as previously described at least with reference to FIGS. 1-2C. As illustrated in FIG. 12A at 1202, the controller may receive a command to perform an erase operation. At 1204, the controller may in response to the command to perform the erase operation, begin execution of the erase operation. At 1206, the controller may receive a command to suspend the execution of the erase operation. At 1208, the controller may in response to the command to suspend the execution of the erase operation, suspend the execution of the erase operation. At 1210, the controller may with the execution of the erase operation suspended, receive a command to perform a program operation. The command to perform the program operation may include an initial program command, a final program confirm command, a multi-plane program confirm command, a cache program confirm command, or another suitable program command. At 1212, the controller may in response to the command to perform the program operation, execute the program operation. At 1214, the controller may in response to the execution of the program operation completing, resume the execution of the erase operation. The controller may resume the execution of the erase operation without receiving a resume command.

Figure 12B:
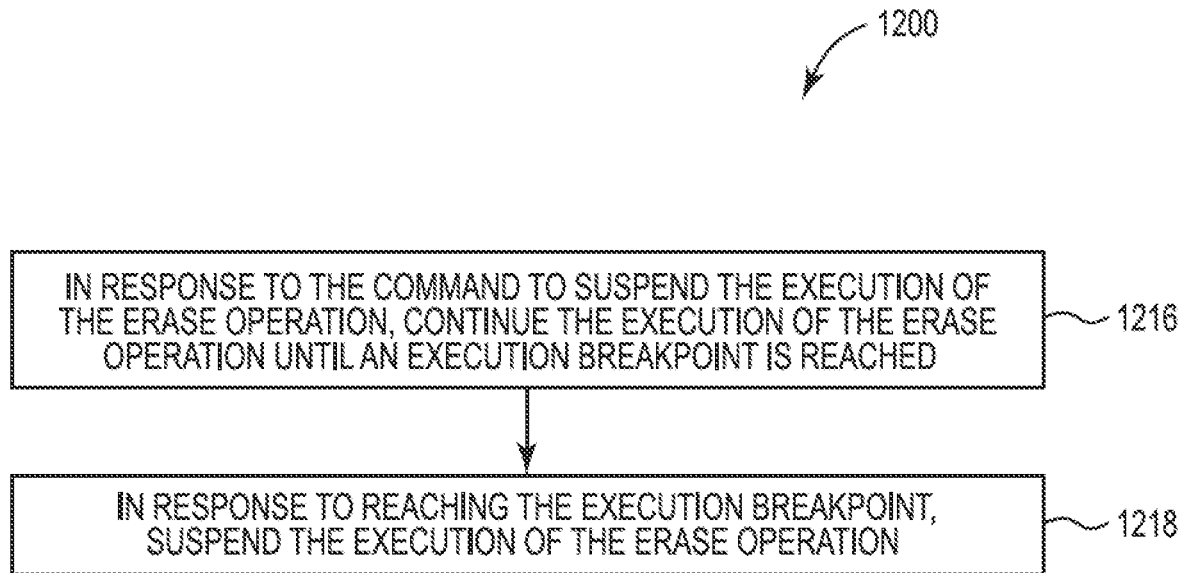

As illustrated in FIG. 12B at 1216, the controller may further in response to the command to suspend the execution of the erase operation, continue the execution of the erase operation until an execution breakpoint is reached. At 1218, the controller may further in response to reaching the execution breakpoint, suspend the execution of the erase operation.

Figure 12C:
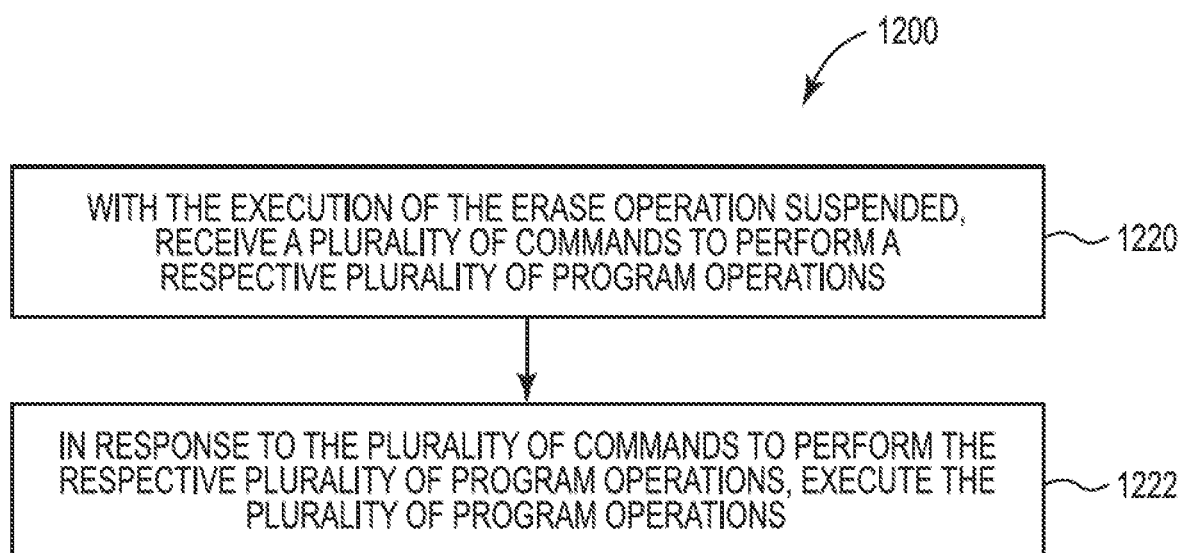

As illustrated in FIG. 12C at 1220, the controller may further with the execution of the erase operation suspended, receive a plurality of commands to perform a respective plurality of program operations. At 1222, the controller may further in response to the plurality of commands to perform the respective plurality of program operations, execute the plurality of program operations. In this embodiment, the memory device may further include a command register (e.g., 124 of FIG. 1) to latch the plurality of commands to perform the respective plurality of program operations in the order they are received. As such, the controller may further execute the plurality of program operations in the order they were received.

Figure 12D:
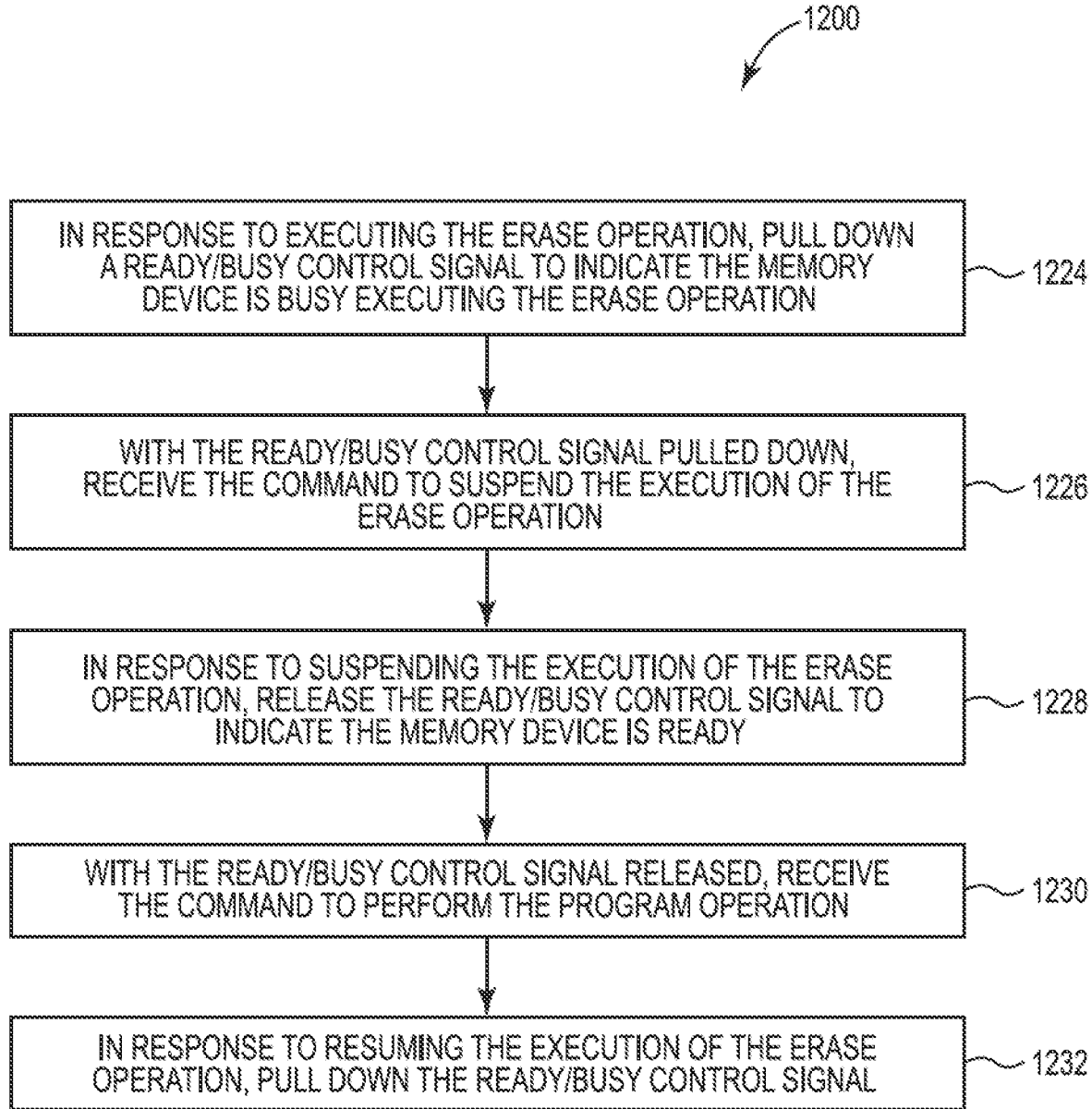

As illustrated in FIG. 12D at 1224, the controller may further in response to executing the erase operation, pull down a ready/busy control signal to indicate the memory device is busy executing the erase operation. At 1226, the controller may further with the ready/busy control signal pulled down, receive the command to suspend the execution of the erase operation. At 1228, the controller may further in response to suspending the execution of the erase operation, releasing the ready/busy control signal to indicate the memory device is ready. At 1230, the controller may with the ready/busy control signal released, receive the command to perform the program operation. At 1232, the controller may further in response to resuming the execution of the erase operation, pull down the ready/busy control signal.

Figure 13:
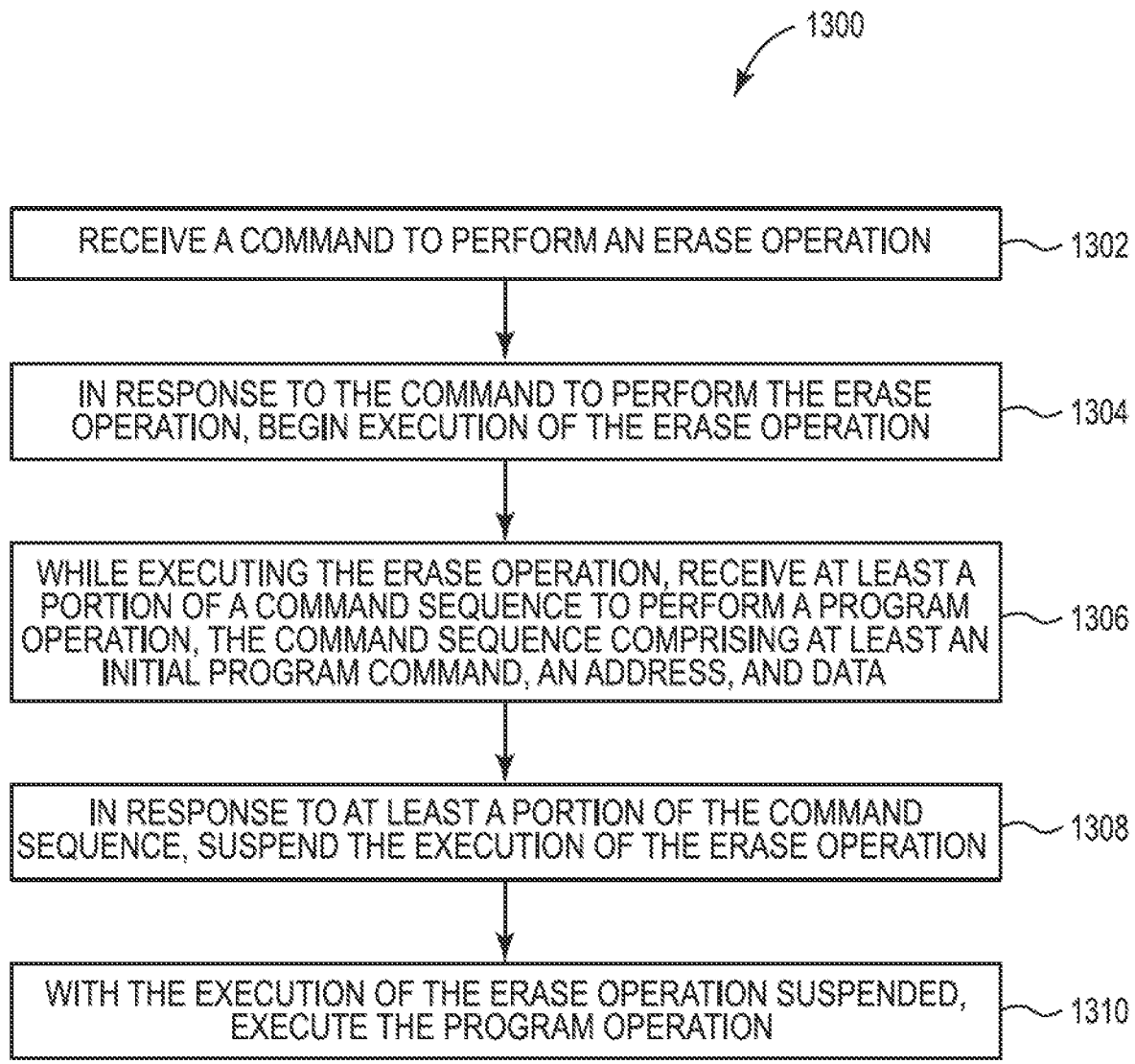
FIG. 13 is a flowchart of a method of operating a memory in accordance with another embodiment.

FIG. 13 is a flowchart of a method 1300 of operating a memory in accordance with another embodiment. Method 1300 may correspond at least in part to FIGS. 6A-6E. For example, FIG. 13 might represent a method of suspending an erase operation to perform a program operation, and resuming the erase operation once the program operation is complete. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 1300 might be implemented within a memory device (e.g., 100) including an array of memory cells (e.g., 104) and a controller (e.g., 116) configured to access the array of memory cells as previously described at least with reference to FIGS. 1-2C. As illustrated in FIG. 13 at 1302, the controller may receive a command to perform an erase operation. At 1304, the controller may in response to the command to perform the erase operation, begin execution of the erase operation. At 1306, the controller may while executing the erase operation, receive at least a portion of a command sequence to perform a program operation, the command sequence comprising at least an initial program command, an address, and data. At 1308, the controller may in response to at least a portion of the command sequence, suspend the execution of the erase operation. In one embodiment, the controller may suspend the execution of the erase operation in response to receiving the address. In another embodiment, the controller may suspend the execution of the erase operation in response to receiving the data. The controller may suspend the execution of the erase operation without receiving a suspend command. At 1310, the controller may with the execution of the erase operation suspended, execute the program operation. The controller may further resume the execution of the erase operation without receiving a resume command.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
an array of memory cells; and
a controller configured to access the array of memory cells,
wherein the controller is further configured to:
receive a command to perform an erase operation;
in response to the command to perform the erase operation, begin execution of the erase operation;
in response to executing the erase operation, pull down a ready/busy control signal to indicate the memory device is busy executing the erase operation;
while executing the erase operation, receive a command to perform a program operation with the ready/busy control signal pulled down;
in response to the command to perform the program operation, suspend the execution of the erase operation while keeping the ready/busy control signal pulled down; and
with the execution of the erase operation suspended, execute the program operation while keeping the ready/busy control signal pulled down.

2. The memory device of claim 1, wherein the controller is further configured to suspend the execution of the erase operation without receiving a suspend command.

3. The memory device of claim 1, wherein the controller is further configured to:
in response to the command to perform the program operation, accept the command to perform the program operation and continue the execution of the erase operation until an execution breakpoint is reached; and
in response to reaching the execution breakpoint, suspend the execution of the erase operation.

4. The memory device of claim 1, wherein the command to perform the program operation comprises an initial program command, and
wherein the controller is further configured to:
with the execution of the erase operation suspended, receive data corresponding to the initial program command and a final program confirm command; and
execute the program operation in response to the final program confirm command.

5. The memory device of claim 1, wherein the command to perform the program operation comprises an initial program command, and
wherein the controller is further configured to:
while executing the erase operation, receive first data corresponding to the initial program command;
with the execution of the erase operation suspended, execute a portion of the program operation based on the first data;
receive second data corresponding to the initial program command and a final program confirm command; and
execute a remaining portion of the program operation in response to the final program confirm command.

6. The memory device of claim 1, wherein the controller is further configured to:
while executing the erase operation, receive the program command, data corresponding to the program command, and a final program confirm command; and
with the execution of the erase operation suspended, execute the program operation.

7. The memory device of claim 6, further comprising:
a command register to latch the plurality of commands to perform the respective plurality of program operations in the order they are received,
wherein the controller is further configured to execute the plurality of program operations in the order they were received.

8. The memory device of claim 1, wherein the controller is further configured to:
with the execution of the erase operation suspended, receive a plurality of commands to perform a respective plurality of program operations; and
in response to the plurality of commands to perform the respective plurality of program operations, execute the plurality of program operations.

9. The memory device of claim 1, wherein the controller is further configured to:
in response to the execution of the program operation completing, resume the execution of the erase operation without receiving a resume command.

10. The memory device of claim 1, wherein the controller is further configured to:
in response to the execution of the program operation completing, resume the execution of the erase operation in response to receiving a resume command.

11. The memory device of claim 1, wherein the command to perform the program operation comprises one of an initial program command, a final program confirm command, a multi-plane program confirm command, and a cache program confirm command.

12. A memory device comprising:
an array of memory cells; and
a controller configured to access the array of memory cells,
wherein the controller is further configured to:
receive a command to perform an erase operation;
in response to the command to perform the erase operation, begin execution of the erase operation;
receive a command to suspend the execution of the erase operation;
in response to the command to suspend execution of the erase operation, continue the execution of the erase operation until an execution breakpoint is reached;
in response to reaching the execution breakpoint, suspend the execution of the erase operation;
with the execution of the erase operation suspended, receive a command to perform a program operation;
in response to the command to perform the program operation, execute the program operation; and
in response to the execution of the program operation completing, resume the execution of the erase operation.

13. The memory device of claim 12, wherein the controller is further configured to resume the execution of the erase operation without receiving a resume command.

14. The memory device of claim 12, wherein the controller is further configured to:
with the execution of the erase operation suspended, receive a plurality of commands to perform a respective plurality of program operations; and
in response to the plurality of commands to perform the respective plurality of program operations, execute the plurality of program operations.

15. The memory device of claim 14, further comprising:
a command register to latch the plurality of commands to perform the respective plurality of program operations in the order they are received,
wherein the controller is further configured to execute the plurality of program operations in the order they were received.

16. The memory device of claim 12, wherein the controller is further configured to:
in response to executing the erase operation, pull down a ready/busy control signal to indicate the memory device is busy executing the erase operation;
with the ready/busy control signal pulled down, receive the command to suspend the execution of the erase operation;
in response to suspending the execution of the erase operation, release the ready/busy control signal to indicate the memory device is ready;
with the ready/busy control signal released, receive the command to perform the program operation; and
in response to resuming the execution of the erase operation, pull down the ready/busy control signal.

17. The memory device of claim 12, wherein the command to perform the program operation comprises one of an initial program command, a final program confirm command, a multi-plane program confirm command, and a cache program confirm command.

18. A memory device comprising:
an array of memory cells; and
a controller configured to access the array of memory cells,
wherein the controller is further configured to:
receive a command to perform an erase operation;
in response to the command to perform the erase operation, begin execution of the erase operation;
while executing the erase operation, receive at least a portion of a command sequence to perform a program operation, the command sequence comprising at least an initial program command, an address, and data;
in response to receiving the initial program command, the address, or data, continue the execution of the erase operation until an execution breakpoint is reached;
in response to reaching the execution breakpoint, suspend the execution of the erase operation; and
with the execution of the erase operation suspended, execute the program operation.

19. The memory device of claim 18, wherein the controller is further configured to suspend the execution of the erase operation in response to receiving the address.

20. The memory device of claim 18, wherein the controller is further configured to suspend the execution of the erase operation in response to receiving the data.

21. The memory device of claim 18, wherein the controller is further configured to suspend the execution of the erase operation without receiving a suspend command.

22. The memory device of claim 18, wherein the controller is further configured to resume the execution of the erase operation without receiving a resume command.

\* \* \* \* \*